(12) United States Patent
Chen

(10) Patent No.: US 11,688,681 B2
(45) Date of Patent: Jun. 27, 2023

(54) DRAM CHIPLET STRUCTURE AND METHOD FOR MANUFACTURING THE SAME

(71) Applicant: AP MEMORY TECHNOLOGY CORPORATION, Hsinchu County (TW)

(72) Inventor: Wenliang Chen, Hsinchu County (TW)

(73) Assignee: AP MEMORY TECHNOLOGY CORPORATION, Hsinchu County (TW)

(*) Notice: Subject to any disclaimer, the term of this patent is extended or adjusted under 35 U.S.C. 154(b) by 127 days.

(21) Appl. No.: 17/346,175

(22) Filed: Jun. 11, 2021

(65) Prior Publication Data

US 2022/0059455 A1  Feb. 24, 2022

Related U.S. Application Data

(60) Provisional application No. 63/069,480, filed on Aug. 24, 2020.

(51) Int. Cl.
| | |
|---|---|
| *H01L 21/00* | (2006.01) |
| *H01L 23/522* | (2006.01) |
| *H01L 21/48* | (2006.01) |
| *H01L 23/528* | (2006.01) |
| *G11C 5/06* | (2006.01) |

(Continued)

(52) U.S. Cl.
CPC ............ *H01L 23/5226* (2013.01); *G11C 5/06* (2013.01); *G11C 11/409* (2013.01); *H01L 21/486* (2013.01); *H01L 21/76802* (2013.01); *H01L 23/528* (2013.01); *H01L 24/14* (2013.01)

(58) Field of Classification Search
CPC ...... H01L 23/5226; G11C 5/06; G11C 11/409
See application file for complete search history.

(56) References Cited

U.S. PATENT DOCUMENTS 11,417,628 B2 * 8/2022 Chen .................. H01L 24/83
2020/0006299 A1  1/2020 Liu et al.
(Continued)

FOREIGN PATENT DOCUMENTS

| CN | 109891582 A | * 6/2019 | ....... H01L 21/76841 |
| CN | 109891582 B | * 6/2020 | ....... H01L 21/76841 |

(Continued)

OTHER PUBLICATIONS

Non-Final Office Action and Search Report of TW family patent Application No. 110126681, dated Mar. 31, 2022.
(Continued)

*Primary Examiner* — Laura M Menz
(74) *Attorney, Agent, or Firm* — WPAT, P.C.; Anthony King

(57) ABSTRACT

A DRAM chiplet structure is provided. The DRAM chiplet structure includes a first hybrid bonding structure, a DRAM interface structure, and a first DRAM core structure. The first hybrid bonding structure has a first surface and a second surface. The DRAM interface structure is in contact with the first surface of the first hybrid bonding structure. The first DRAM core structure is in contact with the second surface of the first hybrid bonding structure. The DRAM interface structure is electrically connected to the first DRAM core structure through the first hybrid bonding structure.

20 Claims, 17 Drawing Sheets

(51) Int. Cl.
    *H01L 23/00*     (2006.01)
    *H01L 21/768*     (2006.01)
    *G11C 11/409*     (2006.01)

(56) References Cited

U.S. PATENT DOCUMENTS

| | | | |
|---|---|---|---|
| 2020/0243455 A1* | 7/2020 | Wang | H01L 24/19 |
| 2022/0028829 A1* | 1/2022 | Cheng | H01L 27/105 |
| 2022/0059455 A1* | 2/2022 | Chen | H01L 21/76802 |

FOREIGN PATENT DOCUMENTS

| | | | | |
|---|---|---|---|---|
| CN | 112908959 A | * | 6/2021 | ......... H01L 23/4824 |
| CN | 113178433 A | * | 7/2021 | ........... H01L 23/481 |
| CN | 113451314 A | * | 9/2021 | |
| CN | 114093872 A | * | 2/2022 | ........... G11C 11/409 |

OTHER PUBLICATIONS

English translation of the Non-final Office Action and Search Report of TW family patent Application No. 110126681, dated Mar. 31, 2022.

* cited by examiner

DRAM CHIPLET STRUCTURE AND METHOD FOR MANUFACTURING THE SAME

PRIORITY CLAIM AND CROSS-REFERENCE

This application claims the benefit of prior-filed U.S. provisional application No. 63/069,480, filed Aug. 24, 2020, and incorporates its entirety herein.

FIELD

The present disclosure relates to a DRAM chiplet structure and method for manufacturing the same, particularly, the disclosed semiconductor structure includes a core structure stacked with an interface structure through a hybrid bonding structure.

BACKGROUND

Dynamic Random Access Memory (DRAM) is a type of semiconductor memory that stores each bit of data in a memory cell consisting of a capacitor and a transistor. Comparing with static random-access memory (SRAM), DRAM has more complicated circuitry and timing requirements than SRAM, but it is much more widely used. The advantage of DRAM is the structural simplicity of its memory cells: only one transistor and a capacitor are required per bit, compared to four or six transistors in SRAM. This allows DRAM to reach extremely high densities, making DRAM much cheaper per bit. The transistors and capacitors used are extremely small; billions can fit on a single memory chip. Due to the dynamic nature of its memory cells, DRAM consumes relatively large amounts of power, with different ways for managing the power consumption.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
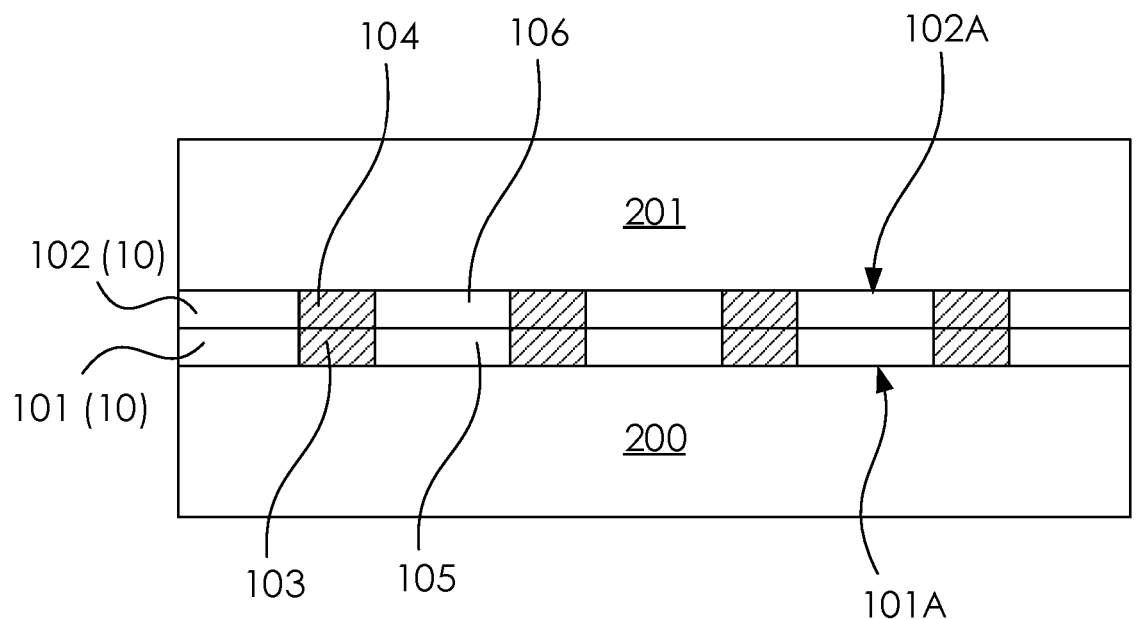
FIG. 1 illustrates a cross-sectional view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer, or section from another. The terms such as "first", "second", and "third" when used herein do not imply a sequence or order unless clearly indicated by the context.

The scaling of silicon integrated circuits to smaller physical dimensions became a primary activity of advanced device development, however, the dimensions of some devices are not reduced as fast as the logic circuits, or even some devices may have a larger dimension in the progress of device development. For example, the total dimension of memory is expected to grow to store more data, even though the dimension of each of the memory cells thereof may be reduced, and thus it is an issue that how to properly integrate the memory with other devices. On the other hand, to achieve high bandwidth of DRAM, it is available to couple each of the DRAM arrays (banks) to the interface of DRAM to acquire a high bandwidth, however, the large amount of internal data wires from each of the DRAM arrays (banks) are difficult to be properly arranged between the DRAM arrays and the interface, these considerations lead to a need to develop a novel DRAM architecture for a better packaging with other semiconductor devices.

FIG. 1 illustrates a DRAM chiplet structure which includes a core structure and an interface structure separately formed in different wafers, and the core structure and the interface structure are electrical connected through wafer-on-wafer packing technique, for example, the hybrid bonding technique. By separating a DRAM into a core structure and an interface structure, the internal data wires of DRAM may be distributed along a vertical direction, and therefore, the bandwidth of DRAM may be increased. In other words, because the project areas of the core structure and the interface structure are larger than the lateral area of the DRAM, it is much easier and possible to distribute thousands of internal data wires communicated within the DRAM (i.e., between the core structure and an interface structure), and a high bandwidth performance of DRAM may be achieved accordingly.

As shown in the FIG. 1, the DRAM chiplet structure includes a hybrid bonding structure 10 sandwiched by a DRAM core structure 201 (hereinafter core structure 201) and a DRAM interface structure 200 (hereinafter interface structure 200). The hybrid bonding structure 10 includes a first surface 101A and a second surface 102A opposite to the first surface 101A. The hybrid bonding structure 10 is configured to integrate and electrically connect the core structure 201 and the interface structure 200. In such embodiments, the core structure 201 is in contact with the first surface 101A of the hybrid bonding structure 10. The interface structure 200 is in contact with the second surface 102A of the hybrid bonding structure 10.

In some embodiments, the hybrid bonding structure 10 includes a first hybrid bonding layer 101 in proximity to the interface structure 200 and a second hybrid bonding layer 102 in proximity to the core structure 201. The first hybrid bonding layer 101 is formed on the interface structure 200 and configured to bond to the second hybrid bonding layer 102. The second hybrid bonding layer 102 is formed on the core structure 201 and configured to bond to the first hybrid bonding layer 101. In some embodiments, each of the first hybrid bonding layer 101 and the second hybrid bonding layer 201 includes a plurality of bond pads 103, 104 laterally surrounded by dielectric material, for example, oxide materials.

Figure 2:
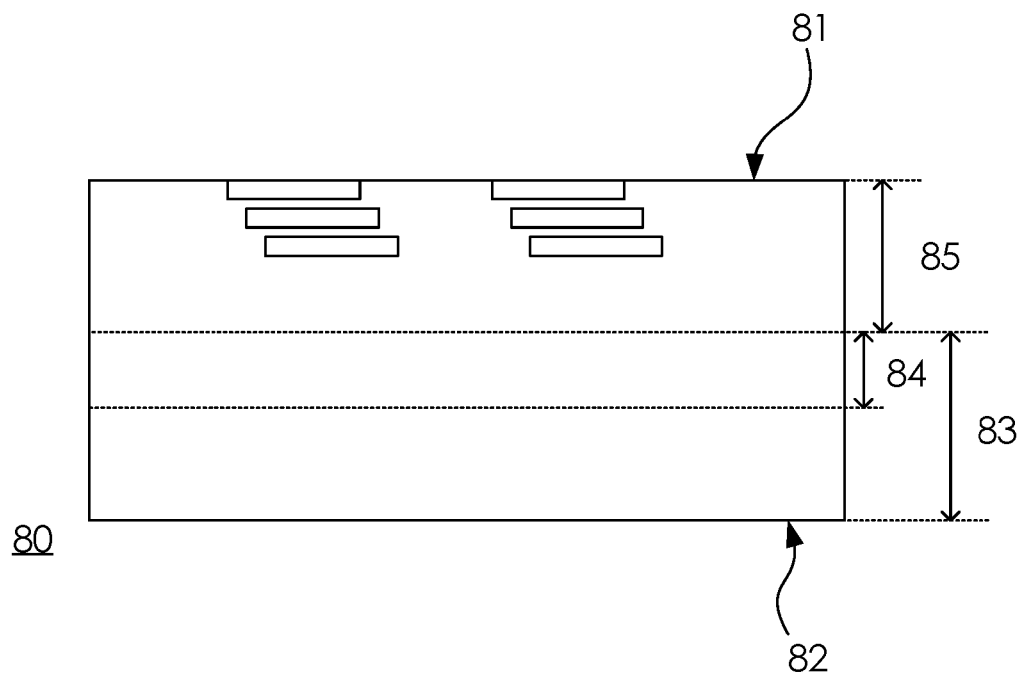
FIG. 2 illustrates a definition of a front side and a back side of a semiconductor structure or a semiconductor wafer.

Hybrid bonding is a method which may connect two substrates or wafers by metal bonding and by oxide bonding at the same time that is, allowing face-to-face or face-to-back, or back-to-back connections of substrates or wafers, For illustration. FIG. 2 shows a definition of a face side and a back side of a semiconductor structure or a semiconductor wafer. For a semiconductor structure or a semiconductor wafer which includes the interface structure 200 and the core structure 201 as previously shown in FIG. 1, each of them may include a semiconductor substrate 83 and a back-end-of-line (BEOL) structure 85, in which a front-end-of-line (FEOL) structure 84 is formed in/on the semiconductor structure 83. According to the embodiments, the surface of the BEOL structure 85 may be the face side 81 of the semiconductor structure 80, and the surface of the semiconductor substrate 83 may be the back side 82 of the semiconductor structure 80. However, this is not a limitation of the present embodiments. The definition of the face side and the back side of a semiconductor structure may be switched.

Accordingly, referring to FIG. 1 again, the interface structure 200 and the core structure 201 may be aligned vertically and therefore a plurality of first bond pads 103 of the first hybrid bonding layer 101 may in contact with a plurality of second bond pads 104 of the second hybrid bonding layer 102, whereas a plurality of first oxide portions 105 of the first hybrid bonding layer 101 are in contact with a plurality of second oxide portions 106 of the second hybrid bonding layer 102. In such embodiments, the distribution of the first bond pads 103 of first hybrid bonding layer 101 is a mirror image of the distribution of the second bond pads 104 of second hybrid bonding layer 102.

In some embodiments, the first bonding pads 103 and the second bonding pads 104 are made by copper (Cu). In some embodiments, the first oxide portions 105 and the second oxide portions 106 are made by dielectric materials such as silicon oxide ($SiO_2$). To make robust Cu—Cu connection, the control of the surface flatness of bonding pads is an important factor. For instance, in some embodiments, the surface of the Cu bonding pads may be controlled to be substantially coplanar to that of the $SiO_2$ portions by performing a chemical mechanical polishing (CMP) operation. Depending on the hybrid bonding operations, in some embodiments, the $SiO_2$ portions can be slightly protruding from the Cu bonding pads. In the present disclosure, for example, the interface structure 200 and the core structure 201 may be bonded by first drawing the first oxide portions 105 into contact with the second oxide portions 106, the aforesaid oxide portions may be bonded via Van der Waals force, subsequently, an annealing operation may be implemented to foster the connections of the first bonding pads 103 and the second bonding pads 104.

Figure 3A:
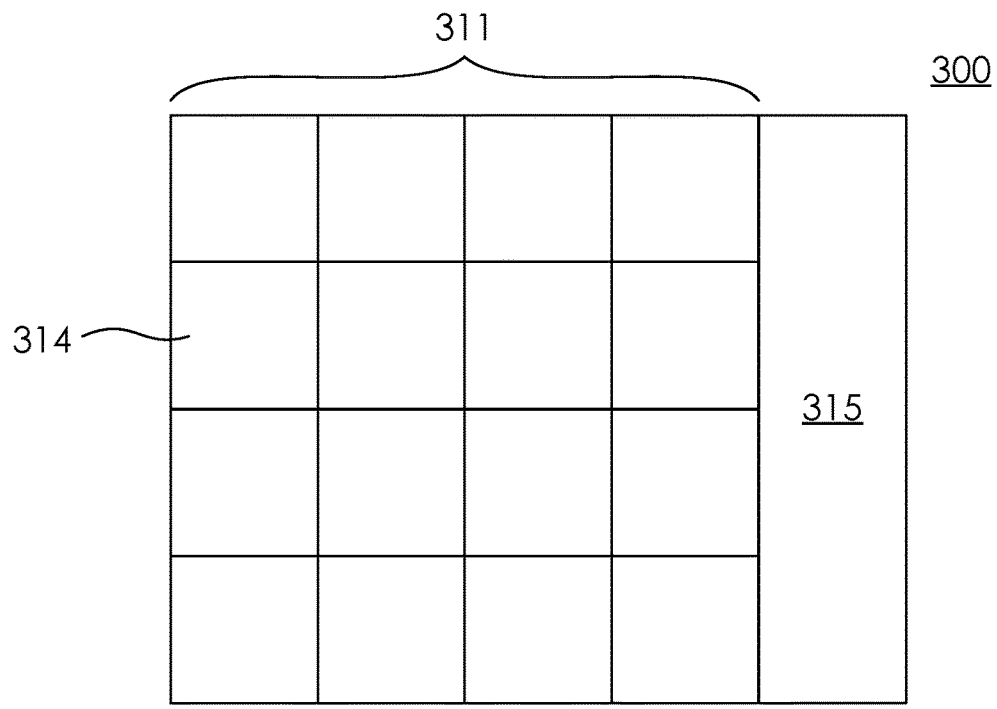
FIG. 3A illustrates a top view of a DRAM structure.

The interface structure 200 and the core structure 201 shown in FIG. 1 are portions of a DRAM structure. As shown in FIG. 3A, a conventional DRAM structure 300 may include a plurality of DRAM arrays 314 within a core region 311, and each of the DRAM arrays 314 is called a memory bank, a DRAM bank, or simply a bank. Each of the DRAM arrays 314 or the so-called banks includes a block of memory cells (not shown) arranged in an array; generally, the DRAM array 314 includes a plurality of word lines and a plurality of bit lines, and each of the memory cells are located at a region where a word line crosses a bit line. In some embodiments, each of the memory cells includes one transistor and one capacitor.

Figure 3B:
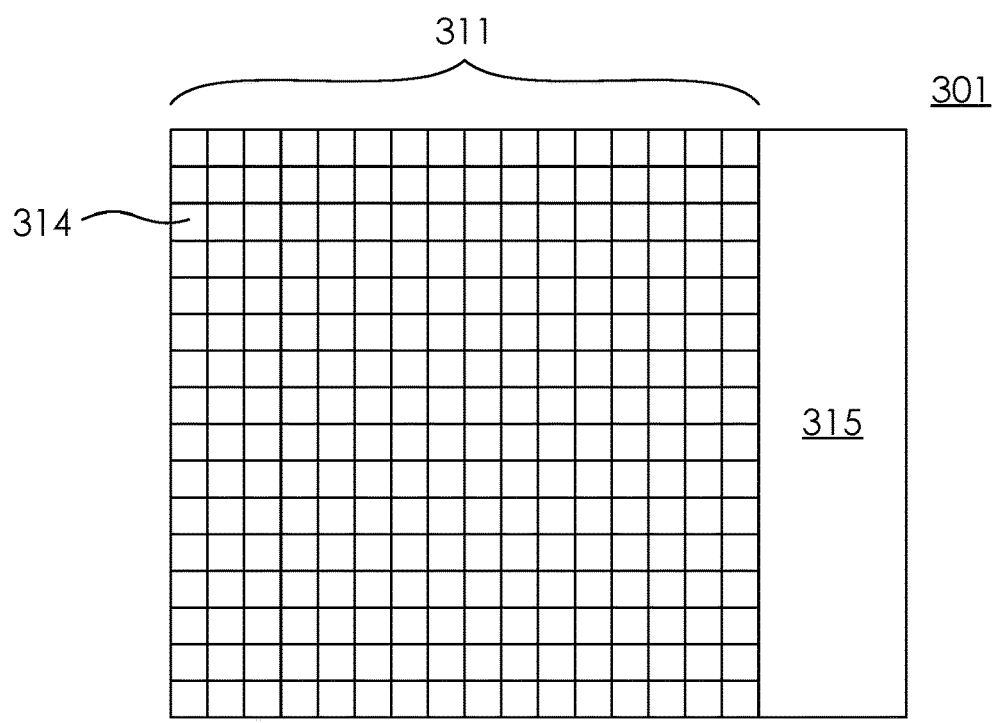
FIG. 3B illustrates a top view of a DRAM structure.

To provide a higher bandwidth DRAM, for example, to provide a DRAM structure having a bandwidth greater than about 128 GB/s, it is a reasonable approach to increase the number of the banks of the DRAM, and each of the banks has a smaller size due to the dimensional limitation of the DRAM structure; meanwhile, the bank density is increased. For instance, comparing the DRAM structure examples shown in FIGS. 3A and 3B, the DRAM structure 300 illustrated in FIG. 3A may have a relatively low bandwidth as about 8 GB/s since there are only 16 banks 314 included; while the DRAM structure 301 illustrated in FIG. 3B may have a relatively high bandwidth as about 256 GB/s since there are 128 banks 314. Considering the architectural constraint of a DRAM chip, the size of each bank 314 of DRAM structure 301 is reduced as well.

Once a bank of the DRAM structure is accessed, it cannot be accessed again until a specific working period is passed, and thus the expansion of the banks can make it easier to independently access different banks in parallel. Although the bandwidth of a DRAM may be increased by adding more banks therein, nevertheless, the number of internal data wires in the DRAM is significantly increased at the same time. For example, the number of internal data wires of the DRAM structure 300 having a relatively low bandwidth illustrated in FIG. 3A may be as about 256; while in the DRAM structure 301 having a relatively high bandwidth illustrated in FIG. 3B, the number of internal data wires thereof may be more than about 4,000. As a consequence of expansion of the banks, the number of I/Os between the core region 311 and the interface region 315 becomes much greater than the number of I/Os between the interface region 315 and the device to be bonded (e.g., a SOC die). Such a huge number of internal data wires between the core region 311 and the interface region 315 has greatly increased the difficulty of the arrangement and routing of the data wire between the core region 311 and the interface region 315 of such DRAM structure.

Therefore, in some embodiments of the present disclosure, the core region 311 and the interface region 315 of the DRAM structure 301 are fabricated on different wafers respectively instead of laterally arranged on a single wafer. These wafers will be bonded though a wafer-on-wafer packaging technique afterwards. Without changing the amount of the banks in the core region 311, the arrangement of the I/Os between the core region 311 and the interface region 315 may be significantly easier than that in a conventional DRAM structure since the entire project area of the wafer can be utilized to arrange the I/Os in the present disclosure. For example, as the scenario shown in FIG. 3B, the core region 311 has 128 banks, and there are 4,096 I/Os between the core region 311 and the interface region 315, while these 4,096 I/Os can be loosely arranged across the surfaces of the wafers. On the other hands, there are only 1,024 I/Os between the interface region 315 and the device to be bonded (e.g., a SOC die). Overall, by effectively using the project area of the wafers and the wafer-on-wafer packaging technique, the arrangement and routing of the data wire between the core region 311 and the interface region 315 of the DRAM structure can be significantly simplified, and therefore the manufacturing cost and yield may be improved.

In other words, the amount of the I/Os between the core region 311 and the interface region 315 is no more the bottleneck that needs to be overcome in advancing the bandwidth of DRAM. That is, the banks of the DRAM structure can further be increased easily without being strictly restricted by the lateral arrangement of the regions, and the bandwidth of the DRAM structure may be increased to another level accordingly.

To be more specific, the interface region and the core region of DRAM are vertically disposed as the DRAM chiplet structure previously shown in FIG. 1 by fabricating the interface structure 200 and the core structure 201 in different substrates or wafers. Accordingly, the interface structure 200 may have an external interface connected to other devices disposed therebelow and have an internal interface connected to the core structure 201 stacked thereon. Thus, the huge amount of internal data wires may effectively utilize the project area of the interface structure 200 and the core structure 201.

Figure 4:
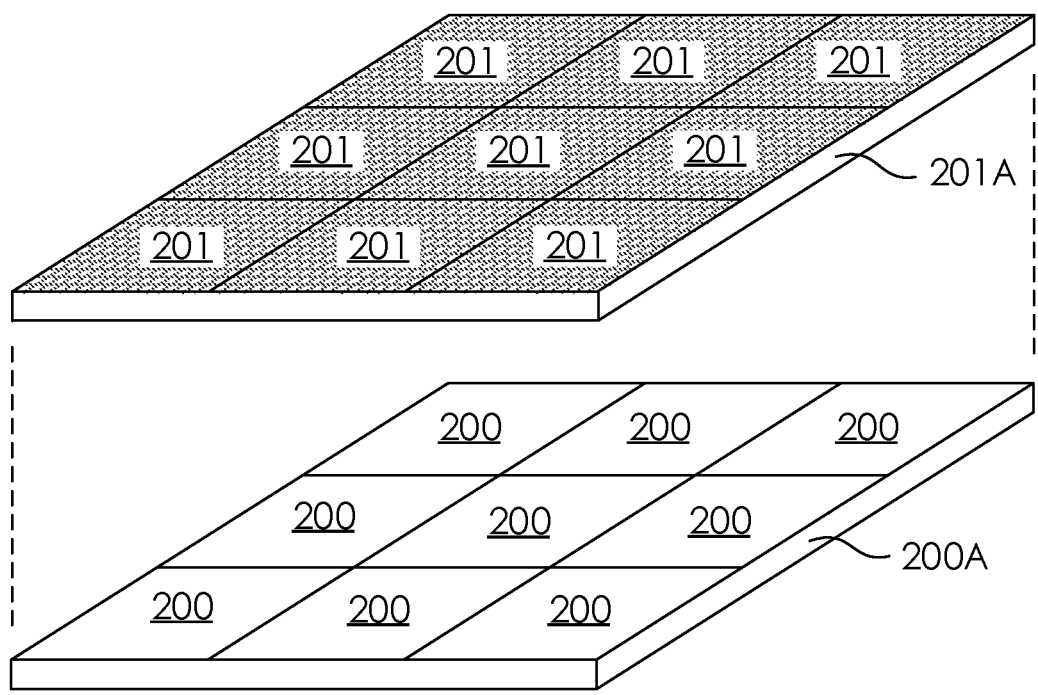
FIG. 4 illustrates a three-dimensional illustration of a semiconductor structure according to some embodiments of the present disclosure.

As shown in FIG. 4, a first wafer 200A and a second wafer 201A may be used to form the interface structures 200 and the core structures 201, respectively. For example, a plurality of interface structures 200 are formed at a side of the first wafer 200A, and a plurality of core structures 201 are formed at a side of the second wafer 201A. As illustrated in the figure, each of the interface structures 200 is vertically aligned to one of the core structures 201 thereabove, and the pair of the interface structure 200 and the core structure 201 may be used to compose the critical portions of a DRAM chiplet structure.

Because the interface structures 200 and the core structures 201 are formed in proximity to one side (e.g., the face side) of the first wafer 200A and the second wafer 201A respectively, and therefore the interface structures 200 and the core structures 201 may be electrically connected by face-to-face arrangement of the first wafer 200A and the second wafer 201A with the hybrid bonding structure therebetween.

Figure 5A:
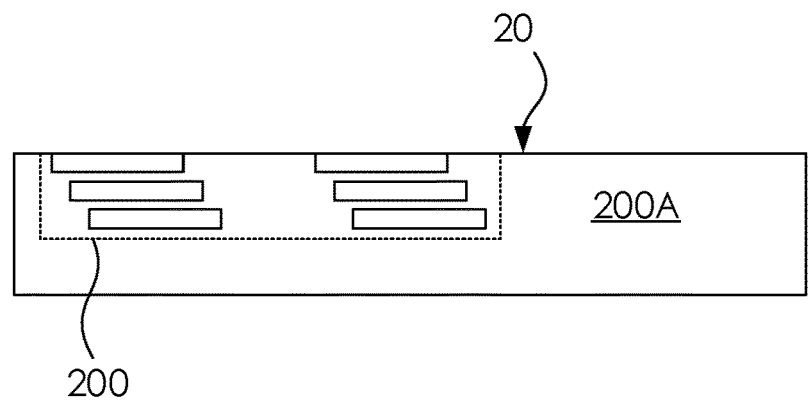
FIG. 5A illustrates a cross-sectional view of a wafer according to some embodiments of the present disclosure.
Figure 5B:
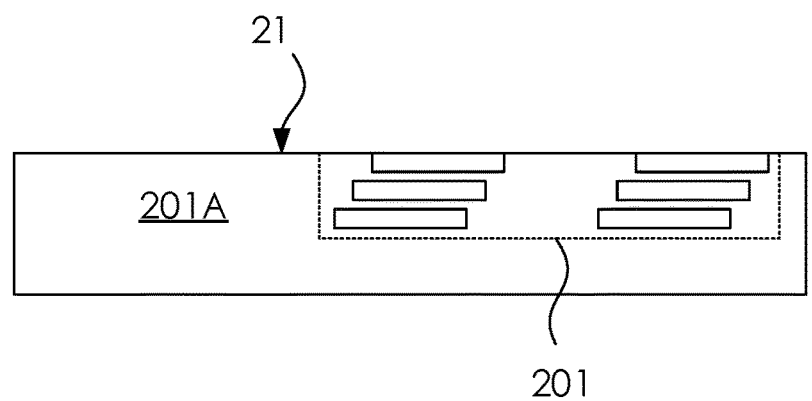
FIG. 5B illustrates a cross-sectional view of a wafer according to some embodiments of the present disclosure.
Figure 5C:
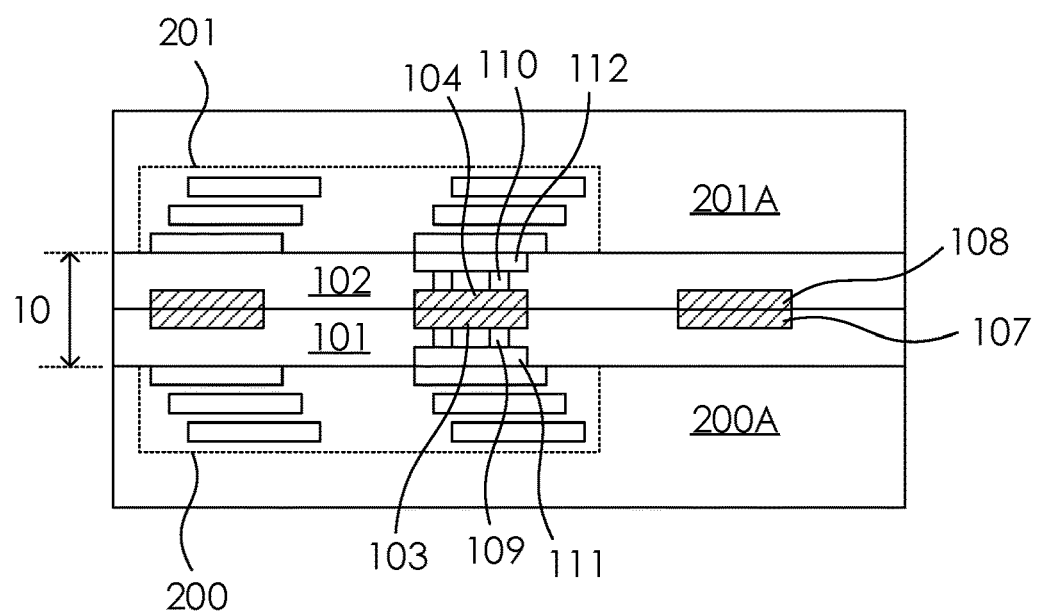
FIG. 5C illustrates a cross-sectional view of a bonded wafer according to some embodiments of the present disclosure.

That is, as shown in FIGS. 5A-5C, the first wafer 200A and the second wafer 201A are stacked in a face-to-face arrangement. In such embodiments, the interface structure 200 is fabricated from the first wafer 200A and is in proximity to the first face side 20 of the first wafer 200A (as shown in FIG. 5A), while the core structure 201 is fabricated from the second wafer 201A and is in proximity to the second face side 21 of the second wafer 201A (as shown FIG. 5B). The hybrid bonding structure 10 as previously described in FIG. 1 is sandwiched by the first wafer 200A and the second wafer 201A since one of the first wafer 200A and the second wafer 201A is flipped to bond toward another one's face side. Thus, the interface structure 200 and the core structure 201 of a single DRAM chiplet structure may be independently formed on different wafers and be electrically connected through the hybrid bonding structure 10 (as shown in FIG. 5C). Accordingly, the internal data wires of the DRAM chiplet structure may be distributed among the project areas of the interface structure 200 and the core structure 201, which is significantly greater than the lateral area therebetween in the conventional DRAM structure as previously shown in FIG. 3A and FIG. 3B.

Figure 5D:
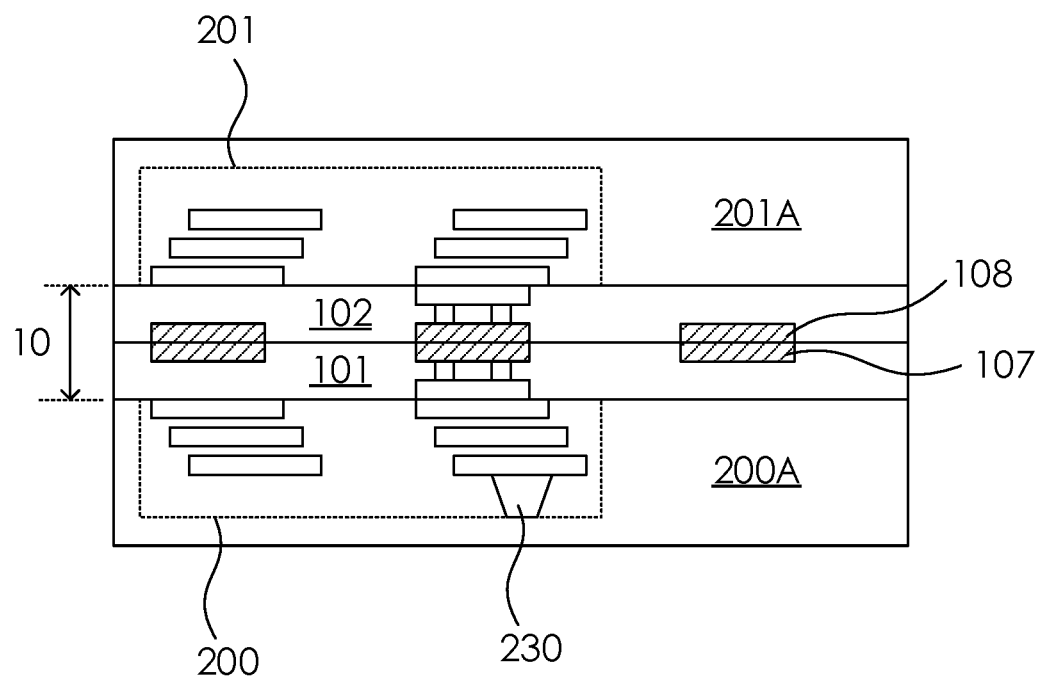
FIG. 5D illustrates a cross-sectional view of a bonded wafer according to some embodiments of the present disclosure.

As shown in FIG. 5D, in some embodiments, the interface structure 200 of a single DRAM chiplet structure may have at least one through silicon via (TSV) 230 having a first end electrically connected to the metallization structure (e.g., a metal plate in the first/bottom metal layer) in the interface structure 200 and a second end electrically connected to the device to be bonded such as the SOC die. Through the TSV 230, signals can be transmitted between the DRAM chiplet structure and the device to be bonded. The TSV 230 can be formed through a via-middle process or a via-first process; that is, the TSV 230 can be formed after the transistor formation and prior to the forming of the BEOL structure of the interface structure 200. Referring to the dashed line in FIG. 5D, the second end of TSV 230 is not exposed until the first wafer 200A is polished or grinded from a back side 22 thereof to thin the first wafer 200A down.

Figure 5E:
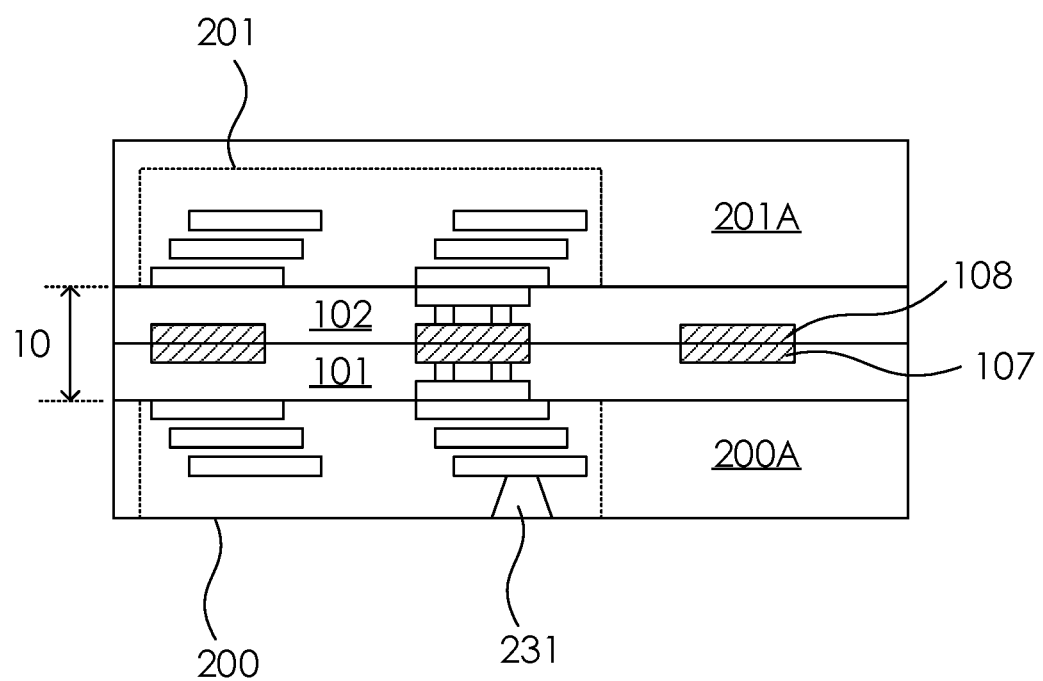
FIG. 5E illustrates a cross-sectional view of a bonded wafer according to some embodiments of the present disclosure.

In other embodiments, as shown in FIG. 5E, the interface structure 200 of a single DRAM chiplet structure may have at least one back side TSV (BTSV) 231 having a first end electrically connected to the metallization structure (e.g., a metal plate in the first/bottom metal layer) in the interface structure 200 and a second end electrically connected to the device to be bonded such as the SOC die, while the BTSV 231 can be formed after both of the FEOL structure and the BEOL structure of the interface structure 200 are formed and the first wafer 200A is already thinned to a specific thickness prior to the via etching and the via filling operations.

In some embodiments, the first hybrid bonding layer 101 may further include a third bonding pad 107 which is electrically disconnected from the interface structure 200. That is, the third bonding pad 107 is a dummy bonding pad that only serving the purpose for hybrid bonding, without being coupled to the top metals or conductive portion in the first wafer 200. Similarly, the second hybrid bonding layer 102 may further include a fourth bonding pad 108 which is electrically disconnected from the core structure 201. The third bonding pad 107 may be utilized to be hybrid bonded to the fourth bonding pad 108 in hybrid bonding operation.

Furthermore, in some embodiments, the first hybrid bonding layer 101 further includes a plurality of first conductive vias 109 in contact with the first bonding pad 103. The first conductive vias 109 is a metal via structure design to possess a small dimension (e.g., small diameter) to prevent connection defects caused by manufacturing operations, and the production yield may be increased thereby. Similarly, the second hybrid bonding layer 201 further includes a plurality of second conductive vias 110 in contact with the second bonding pad 104. In some embodiments, the first hybrid bonding layer 101 further includes a first metal layer 111 in contact with the first conductive vias 109 and electrically connected to the interface structure 200, and the second bonding layer 102 further includes a second metal layer 112 in contact with the second conductive vias 110 and electrically connected to the core structure 201.

Figure 6:
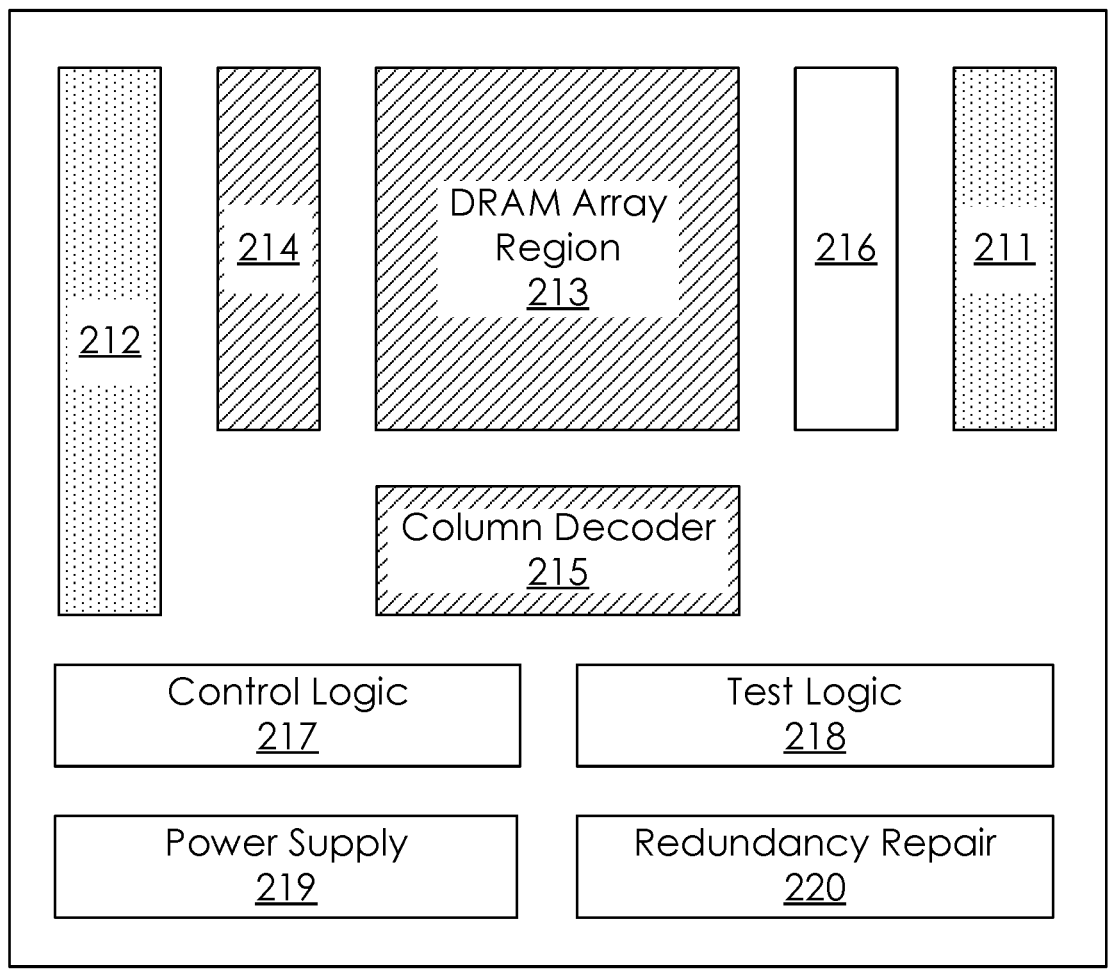
FIG. 6 illustrates an organization diagram of a DRAM according to some embodiments of the present disclosure.

As shown in FIG. 6, the functional components of a regular DRAM may be separated in different portions of the DRAM chiplet structure disclosed in the present disclosure. For instance, a data I/O buffer 211 and a command and/or address buffer 212 are arranged in the interface structure 200 (i.e., the functional components with dotted background in FIG. 6). That is, the functional components for inputting/outputting data signals and for storing command/address signals transmitted through the system bus are fabricated in the substrate or wafer for forming the interface structures 200, while other functional components of a regular DRAM are fabricated in another substrate or wafer for forming the core structures 201 prior to the hybrid bonding operation.

In some embodiments, a DRAM array region 213, at least one row decoder 214, and at least one column decoder 215 are arranged in the core structure 201 (i.e., the functional components with diagonal background in FIG. 6). The DRAM array region 213 may include at least one DRAM array (i.e., the bank), and each of the DRAM arrays includes a plurality of memory cells, wherein each two of the memory cells are electrically isolated by an isolation structure formed between. Each of the DRAM arrays may include a plurality of Row lines and a plurality of Column lines, and they further couple to the row decoder 214 and the column decoder 215, respectively. In other words, in some embodiments, the interface structure 200 is free from including the DRAM array region 213, the row decoder 214, or the column decoder 215. Likewise, the core structure 201 is free from including the data I/O buffer 211 or the command and/or address buffer 212.

Figure 7:
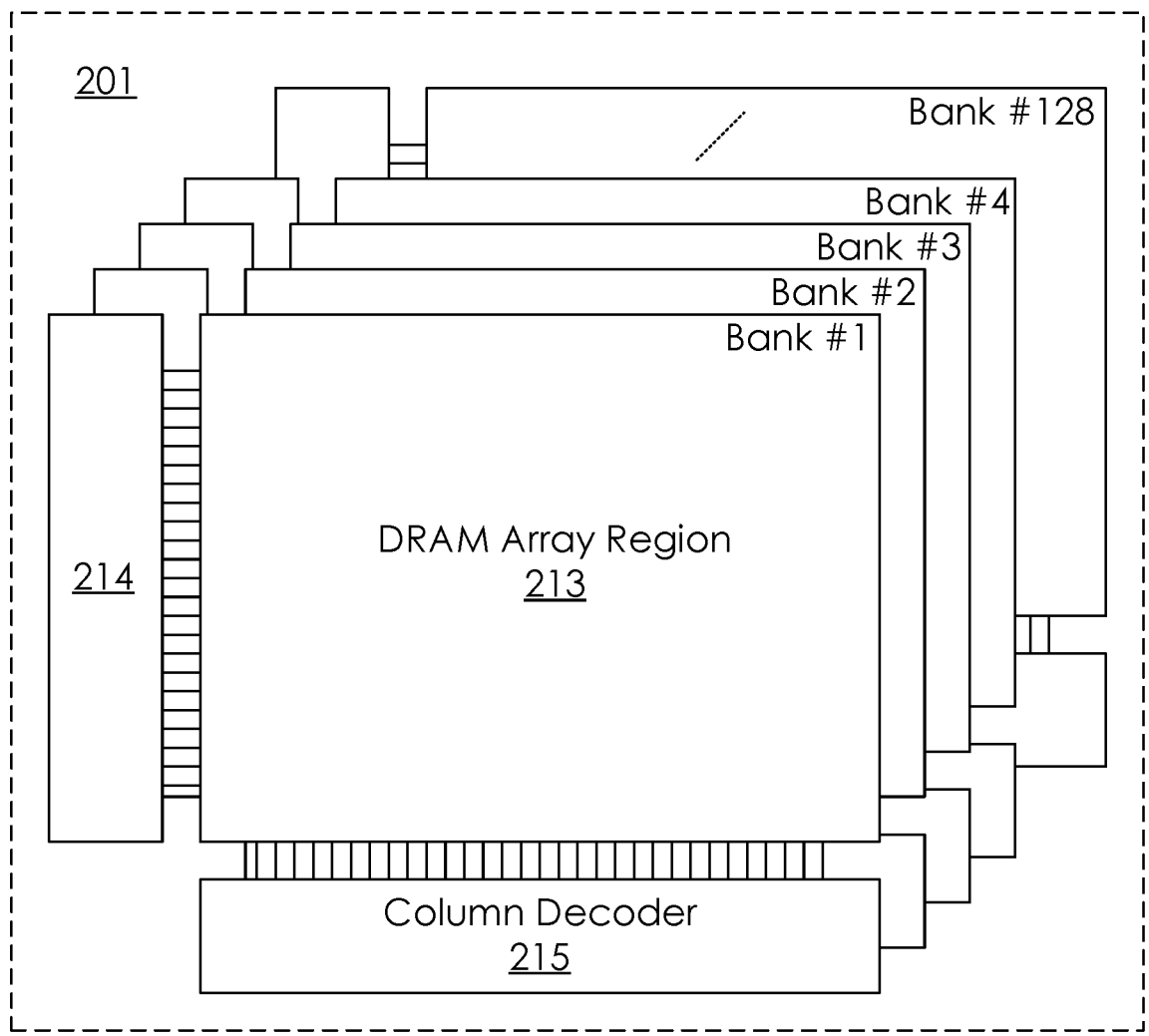
FIG. 7 illustrates an organization diagram of a DRAM structure according to some embodiments of the present disclosure.

The present disclosure provides a DRAM chiplet structure having an interface structure 200 and a least one core structure 201 stacked thereon. Such DRAM chiplet structure is particularly suitable for high bandwidth DRAM requirement, for example, with a bandwidth at about or more than about 256 GB/s. To deliver 256 GB/s bandwidth, the interface structure 200 of the DRAM chiplet structure may have 1,024 I/Os lines and 2 Gbps (data rate) per pin, while such DRAM chiplet structure may support up to 16 independent channels (64 bits each) and each channel may have 64 I/Os and 8 banks. That is, as shown in FIG. 7, in some embodiments, the core structure 201 may include 128 (16×8) DRAM array (banks), and the channels having 8 banks each may function independently. Furthermore, because DRAM is built on a highly pipelined architecture, and therefore it has a certain amount of latency between requests for data and the actual execution of that request. In the abovementioned embodiments, the channels of the DRAM chiplet structure may have 8 or even more banks, high throughput may be performed since the data bus may be filly occupied, and that is, such DRAM chiplet structure allows to access several pieces of data sequentially instead of treating each request separately.

The DRAM chiplet structure in the present disclosure may have more than one channel, while each channel has at least 32 I/Os. In some embodiments, the data rate of each I/O is at least 1 Gbps. In some embodiments, each channel has at least 8 banks. Because the DRAM chiplet structure in the present disclosure may effectively utilize the project area of the interface structure 200 and the core structure 201 and a huge amount of internal data wires therebetween may easily be distributed, the DRAM chiplet structure in the present disclosure is particularly suitable for DRAM having a relatively high bandwidth. Therefore, in some embodiments, the DRAM chiplet structure may have no fewer than 16 channels, while each channel may have 64 I/Os and 8 banks. In those embodiments, the data rate of each I/O is at least 2 Gbps. However, these are not hard limitations of the present embodiments. With the advance of DRAM technique other than the features disclosed in the present disclosure, the specification of the DRAM may be altered as well.

Other than the functional components of a regular DRAM as aforementioned, the DRAM chiplet structure of the present disclosure may include some functional components that may be optionally arranged in the interface structure 200 or the core structure 201. For example, the core structure 201 may further include an R/W (read/write) buffer 216, a control logic 217, a test logic 218, a power supply 219, and/or a redundancy repair 220. Likewise, in other embodiments, the RW (read/write) buffer 216, the control logic 217, the test logic 218, the power supply 219, and/or the redundancy repair 220 are arranged in the interface structure 200.

The R/W buffer 216 may be configured to hold data read/written from/to the DRAM array region 213. The control logic 217 may be a control circuit adapted for receiving an address, write data, and a data rewrite command from a host controller and designating a row address and a column address to the DRAM array region 213. The test logic 218 may control the operation of certain functions within the DRAM chiplet structure in carrying out read stability, write margin, and read margin tests. The power supply 219 may be utilized to supplying power for the components in the DRAM chiplet structure. The redundancy repair 220 is a repair logic which may be used for repairing the failed memory cells.

Accordingly, in some embodiments, the interface structure 200 can at least free from including logic circuits such as the control logic 217. In contrast, some conventional DRAM structure may have a plurality of DRAM dies stacked over a logic die or a base die, while such logic die or base die includes logic circuits, and thus they are substantially different to the interface structure 200 disclosed in some embodiments of the present disclosure. In some embodiments, only the essential components are arranged in the interface structure 200.

In other embodiments, more functional components are arranged in the interface structure 200. For example, the R/W (read/write) buffer 216, the redundancy repair 220, are arranged in the interface structure 200. In some embodiments, some extra I/Os (other than the I/Os for the DRAM arrays) may be formed in the interface structure 200 for error-correcting code (ECC) or parity support.

Figure 8A:
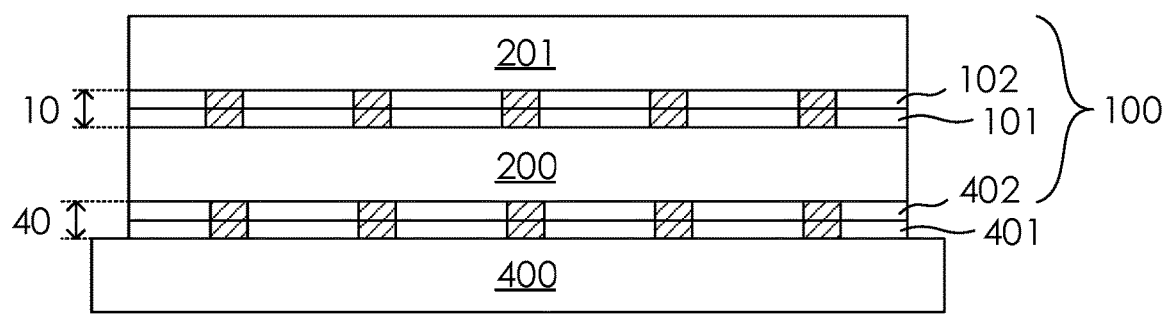
FIG. 8A illustrates a cross-sectional view of a semiconductor structure according to some embodiments of the present disclosure.

In some embodiments, the DRAM chiplet structure may be packaged with a logic System on a Chip (SOC) through 3D packaging technique. As shown in FIG. 8A, the DRAM chiplet structure 100 may include the interface structure 200 and the core structure 201 vertically stacked over the interface structure 200 through the first hybrid bonding structure 10, which may be implemented by wafer-on-wafer (WoW) hybrid bonding technique. In some embodiments, the DRAM chiplet structure 100 may be bonded over a logic SOC 400 through chip-on-wafer hybrid bonding technique. For example, a third hybrid bonding structure 40 may be utilized to electrically connect the DRAM chiplet structure 100 and the logic SOC 400. To be more detailed, similar with the first hybrid bonding structure previously disclosed in FIG. 1, the third hybrid bonding structure 40 may have a pair of hybrid bonding layers 401, 402, wherein the hybrid bonding layer 401 is in proximity to the logic SOC 400, and the hybrid bonding layer 402 is in proximity to the interface structure 200. The hybrid bonding layers 401, 402 are formed on the surfaces of the logic SOC 400 and the interface structure 200, respectively, prior to being bonded through the hybrid bonding operation.

Figure 8B:
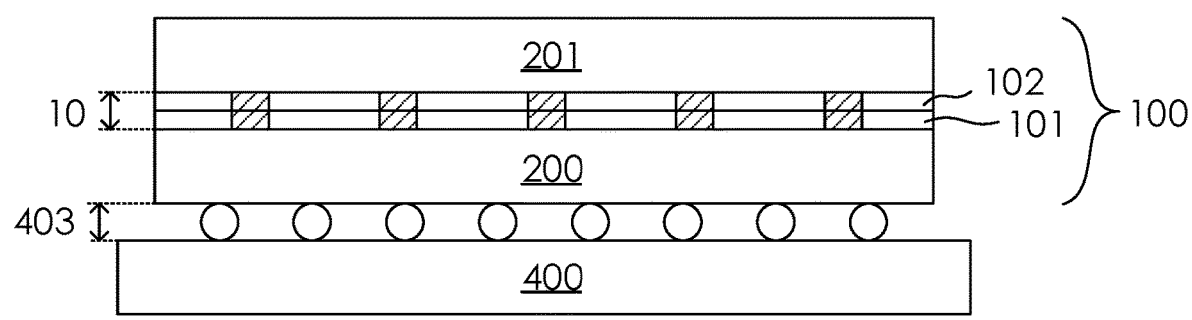
FIG. 8B illustrates a cross-sectional view of a semiconductor structure according to some embodiments of the present disclosure.

In other embodiments, as shown in FIG. 8B, the DRAM chiplet structure 100 may include the interface structure 200 and the core structure 201 vertically stacked over the interface structure 200 through the first hybrid bonding structure 10, while the DRAM chiplet structure 100 is bonded over the logic SOC 400 through a first conductive bump connection 403. In such embodiments, the first conductive bump connection 403 is formed by suitable micro bumping operation which a plurality of solder bumps can be observed.

Figure 8C:
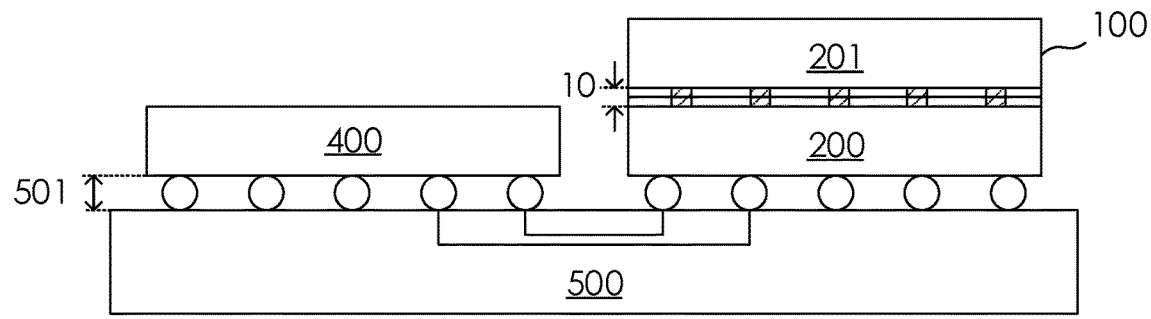
FIG. 8C illustrates a cross-sectional view of a semiconductor structure according to some embodiments of the present disclosure.
Figure 8D:
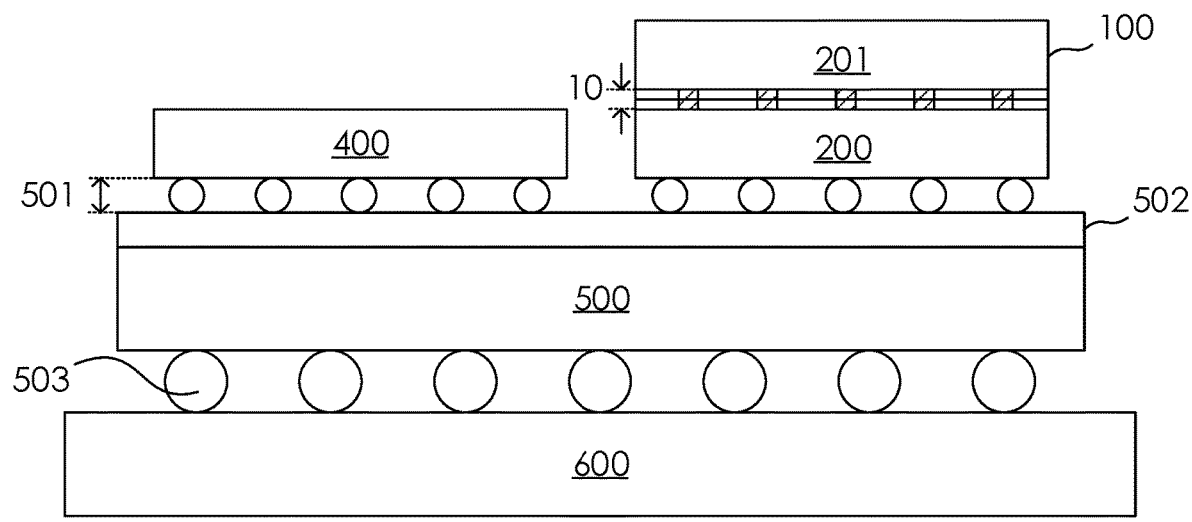
FIG. 8D illustrates a cross-sectional view of a semiconductor structure according to some embodiments of the present disclosure.

In some embodiments, the DRAM chiplet structure may be packaged with the logic SOC through 2.5D packaging technique. As shown in FIG. 8C, the DRAM chiplet structure 100 may include the interface structure 200 and the core structure 201 vertically stacked over the interface structure 200 through the first hybrid bonding structure 10, which may be implemented by WoW hybrid bonding technique. In some embodiments, the DRAM chiplet structure 100 and a semiconductor die having a logic circuit structure, such as the logic SOC 400, may be bonded over an interposer 500. The interposer 500 may support the DRAM chiplet structure 100 and the logic SOC 400. In some embodiments, the DRAM chiplet structure 100 and the logic SOC 400 may be electrically connected through the lateral routing in the interposer 500. In some embodiments, the interposer 500 is electrically connected to the DRAM chiplet structure 100 and the logic SOC 400 by a second conductive bump connection 501 between the interposer 500 and the devices thereon (i.e., the DRAM chiplet structure 100 and the logic SOC 400). In some embodiments, as shown in FIG. 8D, a redistribution layer 502 is disposed over the interposer 500 for fan-out routing the signals. Furthermore, the redistribution layer 502 over the interposer 500 may adapt a higher density I/O proximal to the DRAM chiplet structure 100 and the logic SOC 400 to a lower density I/O proximal to a substrate 600 therebelow.

Figure 9A:
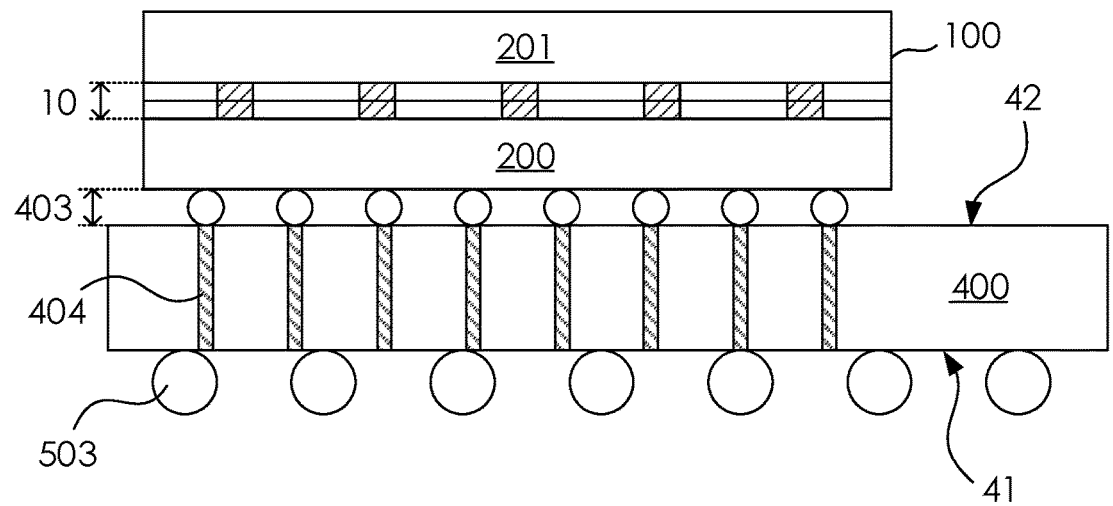
FIG. 9A illustrates a cross-sectional view of a semiconductor structure according to some embodiments of the present disclosure.

The logic SOC 400 has a face side 41 and a back side 42 opposite to the face side 41. In some embodiments, the logic circuit of the logic SOC 400 may be fabricated in proximity to the face side 41 thereof. As shown in FIG. 9A, in the scenario that the DRAM chiplet structure 100 is bonded on the back side 42 of the logic SOC 400, the logic SOC 400 may electrically connect to the devices therebelow through a plurality of controlled Collapse Chip Connection (C4) bumps 503 in contact with the face side 41 of the logic SOC 400. Furthermore, the DRAM chiplet structure 100 is bonded on the back side 42 of the logic SOC 400 may electrically connect to the devices below the logic SOC 400 through a plurality of TSVs 404. In some embodiments, the DRAM chiplet structure 100 may in contact with one end of each of the TSVs 404 (not shown in FIG. 9A). In other embodiments, the DRAM chiplet structure 100 may in contact with the first conductive bump connection 403 for electrical connecting (as shown in FIG. 9A).

Figure 9B:
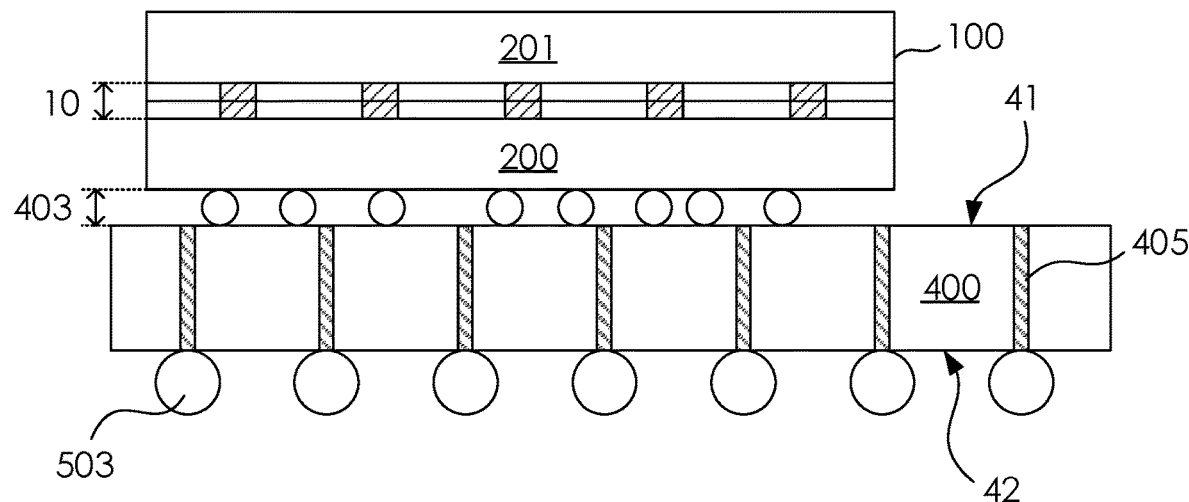
FIG. 9B illustrates a cross-sectional view of a semiconductor structure according to some embodiments of the present disclosure.

As shown in FIG. 9B, in the scenario that the DRAM chiplet structure 100 is bonded on the face side 41 of the logic SOC 400, the logic SOC 400 may electrically connect to the devices therebelow through a plurality of TSVs 405 thereof to in contact with the C4 bumps 503 in contact with the back side 42 of the logic SOC 400.

Figure 10A:
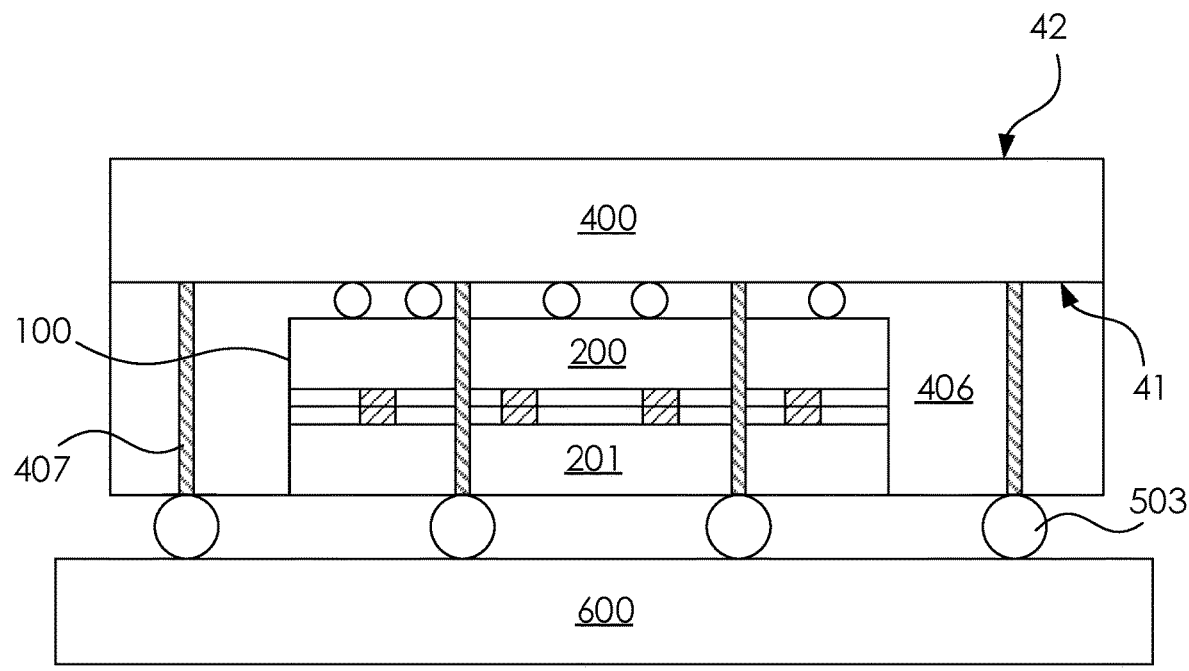
FIG. 10A illustrates a cross-sectional view of a semiconductor structure according to some embodiments of the present disclosure.

In some embodiments, the bonded DRAM chiplet structure 100 and the logic SOC 400 are flipped for bonding on the substrate 600, and thus the C4 bumps 503 are in proximity to the core structure 201 of the DRAM chiplet structure 100 instead of the back side 42 of the logic SOC 400. As shown in FIG. 10A, the DRAM chiplet structure 100 may include the interface structure 200 and the core structure 201 vertically stacked over the interface structure 200 through the first hybrid bonding structure 10, which may be implemented by WoW hybrid bonding technique. The DRAM chiplet structure 100 may be bonded over the logic SOC 400 through chip-on-wafer hybrid bonding technique (not shown in FIG. 10A) or a conductive bump connection. By using the conductive bump connection, the DRAM chiplet structure 100 is between the semiconductor die (e.g., the logic SOC 400) and the conductive bump (e.g., C4 bumps 503). The DRAM chiplet structure 100 may be laterally surrounded by a dielectric material 406. In some embodiments, the dielectric material 406 may have a surface coplanar with a top surface of the DRAM chiplet structure 100. In other embodiments, the DRAM chiplet structure 100 may be covered by the dielectric material 406.

In some embodiments, the plurality of C4 bumps 503 are formed on a side of the dielectric material 406. In such embodiments, a plurality of TSVs 407 penetrate the dielectric material 406 to electrically connect the C4 humps and the logic SOC 400. Since a portion of the logic SOC 400 is covered by the DRAM chiplet structure 100, the logic SOC 400 may have a bonding region 408 specifically for bonding with DRAM chiplet structure 100, that is, the bonding region 408 if free from in contact with the TSVs 407.

Figure 10B:
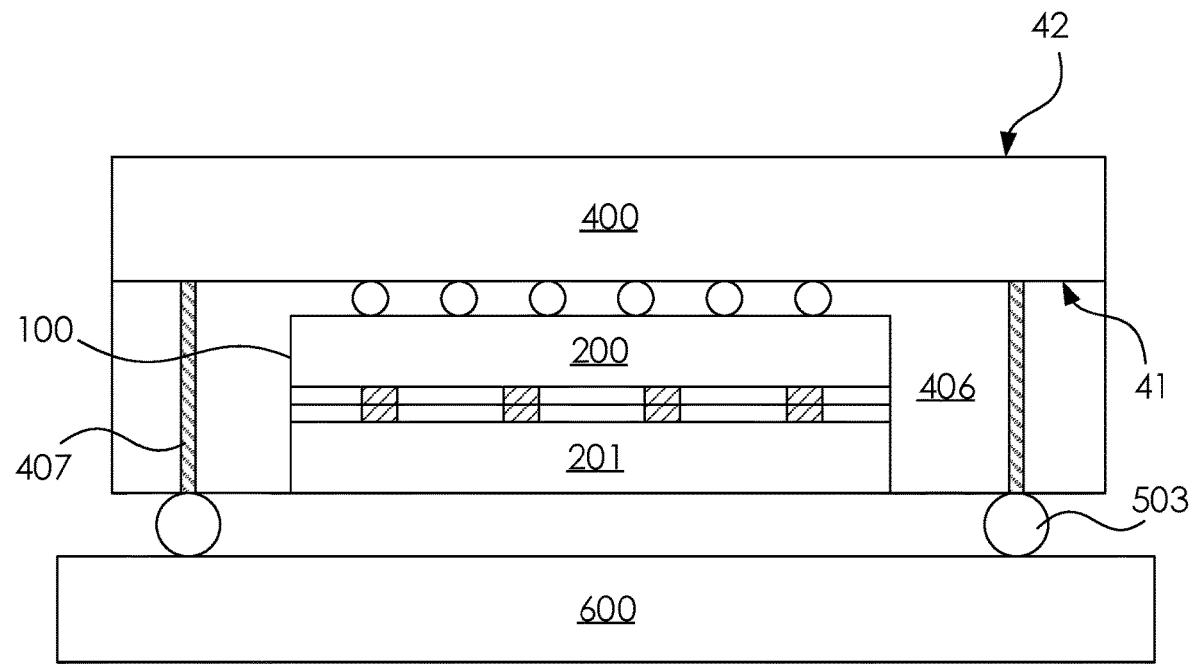
FIG. 10B illustrates a cross-sectional view of a semiconductor structure according to some embodiments of the present disclosure.

In other embodiments, as shown in FIG. 10B, the DRAM chiplet structure 100 may be penetrated by several TSVs 409. The TSVs 409 are utilized to electrically connect the logic SOC 400 and the C4 bumps in proximity to the core structure 201 of the DRAM chiplet structure 100. In such embodiments, the TSVs 409 are electrically disconnected to the DRAM chiplet structure 100 within the physical structure of the DRAM chiplet structure 100. Moreover, the TSVs 409 bypass the micro bumps in the conductive bump connection 403, and in the scenario that the DRAM chiplet structure 100 is bonded to the logic SOC 400 through hybrid bonding technique, the TSVs 409 bypass the bonding pads in the hybrid bonding structure (not shown in FIG. 10B).

Figure 11A:
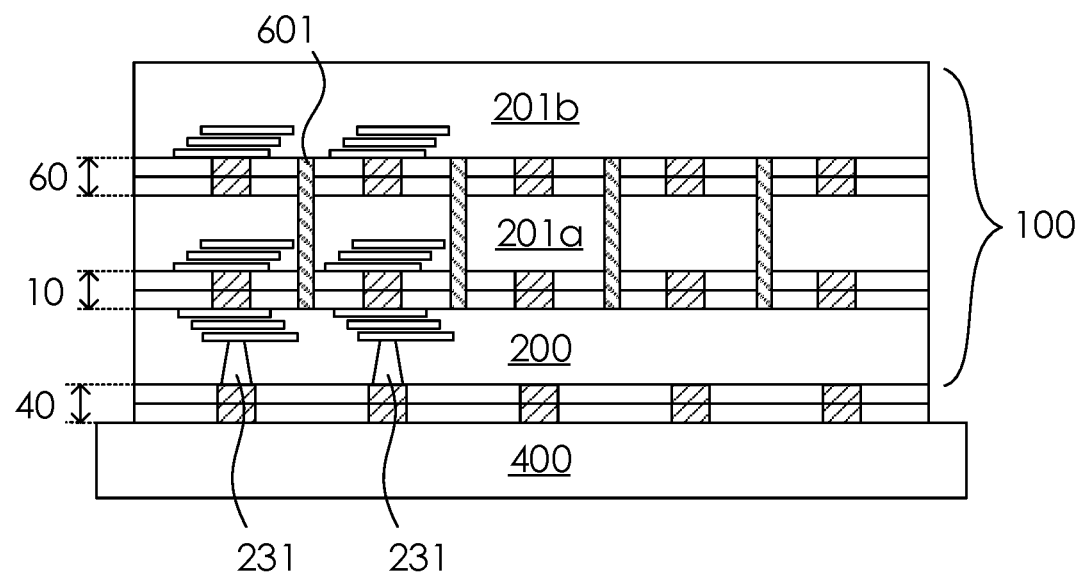
FIG. 11A illustrates a cross-sectional view of a semiconductor structure according to some embodiments of the present disclosure.
Figure 11B:
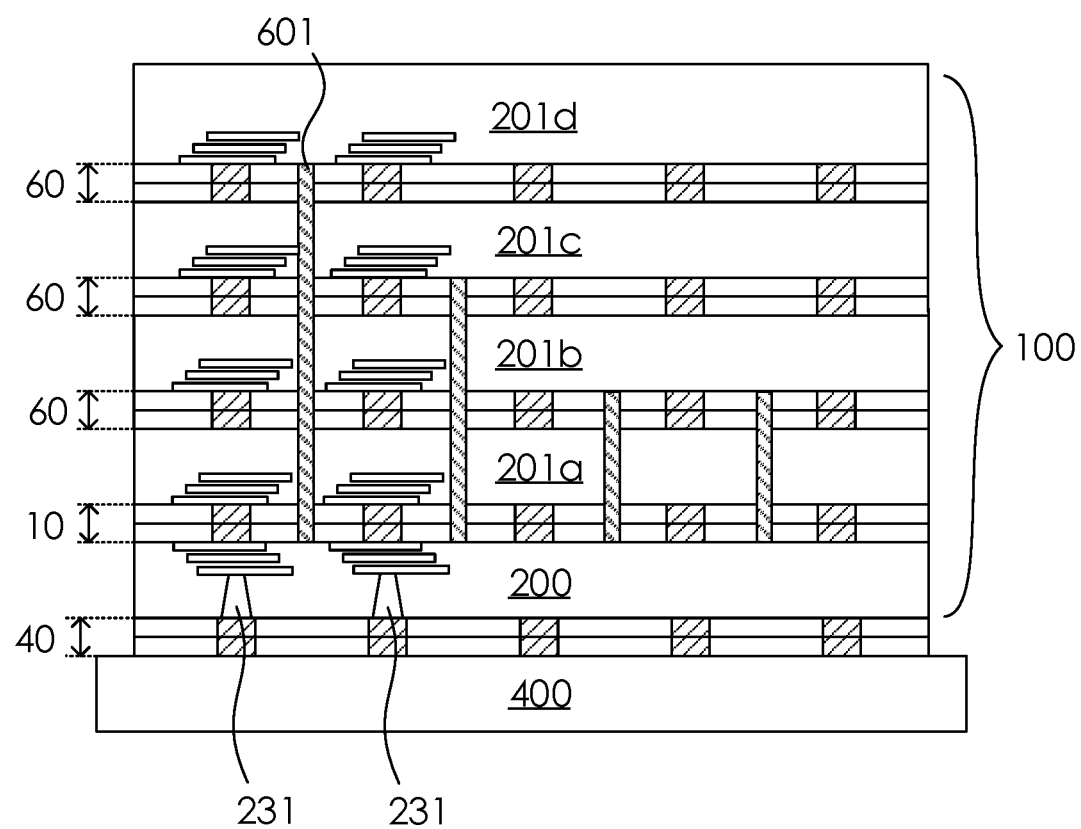
FIG. 11B illustrates a cross-sectional view of a semiconductor structure according to some embodiments of the present disclosure.

In some embodiments, the DRAM chiplet structure 100 may include more than one core structures 201 vertically stacked over the interface structure 200. As shown in FIG. 11A, at least one second core structure (e.g., the second core structure 201b) may be disposed over the first core structure 201a, and a second hybrid bonding structure 60 is sandwiched by the first and second core structures 201a, 201b. Each of the first and second core structures 201a, 201b is identical to the core structure 201 previously disclosed. The details of the second hybrid bonding structure 60 are like that of the first hybrid bonding structure 10 as previously discussed. In some embodiments, first and second core structures 201a, 201b are stacked in a face-to-back arrangement, for example, the face side of the core structure 201b is in proximity to the back side of the core structure 201a, while the first core structure 201 is stacked over the interface structure 200 in a face-to-face arrangement. In some embodiments, the DRAM chiplet structure 100 may have at least one TSV 601 penetrates the first core structure 201a to electrically connect the second core structure 201b to the interface structure 200. In some embodiments, as shown in FIG. 11B, there are two or more core structures (e.g., the second, third, and fourth core structures 201b, 201c, 201d) vertically stacked over the first core structure 201a, and each of the core structures may electrically connect to the interface structure 200 therebelow through at least one TSV 601. In some embodiments, the each of the two adjacent core structures are stacked in a face-to-back arrangement. In some embodiments, two or more of the second hybrid bonding structures 60 are disposed over the first core structure 201a, and each of the second hybrid bonding structures 60 are sandwiched by the adjacent core structures (e.g., the second, third, and fourth core structures 201b, 201c, 201d). In other words, at least one DRAM core structure includes a plurality of core structure 201 electrically connected to each other through a plurality of second hybrid bonding structures 60.

In some embodiments, prior to hybrid bonding the wafer having core structures (e.g., the second wafer 201A previously shown in FIG. 4) over the wafer having core structures, the wafer having the core structures that going to be hybrid bonded from back side will be thinned down by a thinning operation. The thinning operation may be implemented by mechanical polishing, chemical-mechanical polishing (CMP), wet etching, dry etching, or combination thereof. In some embodiments, the thickness of the substrate or wafer is thinned to be fewer than about 50 μm. By decreasing the thickness of the core structures, it is easier to form the TSVs 601 to electrically connect the interface structure 200. In some embodiments, a wafer that includes core structures for forming the topmost core structure in the DRAM chiplet structure 100 may omit the thinning operation because no TSV 601 is required to be formed through the topmost core structure in the DRAM chiplet structure 100. Accordingly, in some embodiments, a topmost one of the core structures (e.g., the second core structure 201b FIG. 11A or the fourth core structure 201d in FIG. 11B) may be the thickest among the core structures over the interface structure 200. It is also shown in FIGS. 11A and 11B that the BTSVs 231 are electrically connected to the metallization structure (e.g., a metal plate in the first/bottom metal layer) of the interface structure 200 for the signal transmission between the interface structure 200 of the DRAM chiplet structure 100 and the logic SOC 400. In other embodiments, the interface structure 200 of the DRAM chiplet structure 100 and the logic SOC 400 may communicate through one or more TSVs 230 as previously shown in FIG. 5D instead of the BTSVs 231.

Figure 12A:
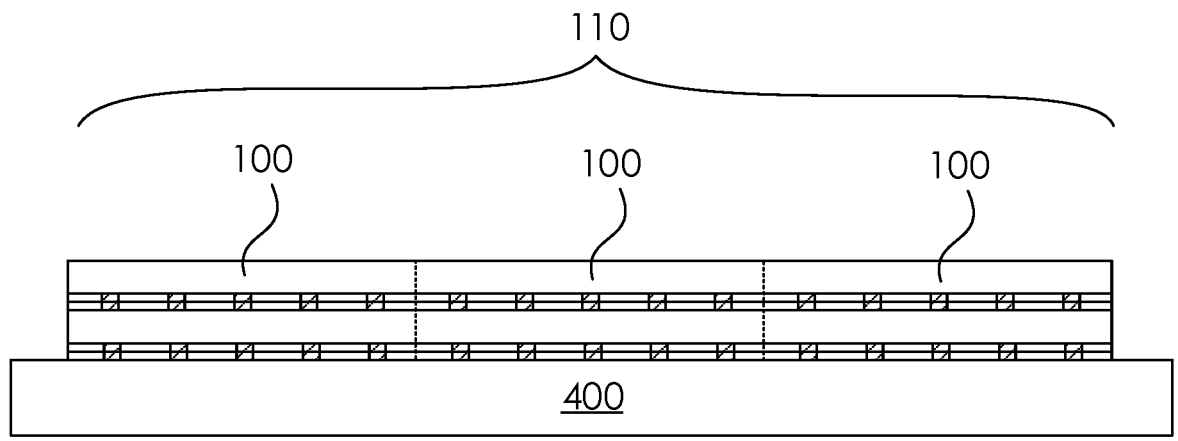
FIG. 12A illustrates a cross-sectional view of a semiconductor structure according to some embodiments of the present disclosure.
Figure 12B:
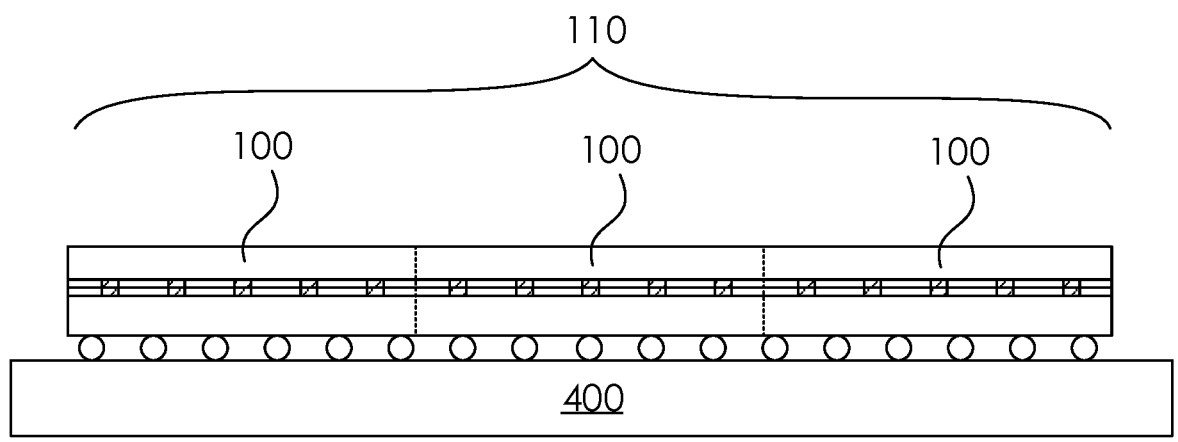
FIG. 12B illustrates a cross-sectional view of a semiconductor structure according to some embodiments of the present disclosure.

In some embodiments, there are multiple DRAM chiplet structures 100 laterally combined as a block unit 110 bonded over the logic SOC 400. As shown in FIGS. 12A and 12B, there are three DRAM chiplet structures 100 bonded over the logic SOC 400 while these DRAM chiplet structures 100 are free from being diced into three single DRAM chiplet structures. That is, in some embodiments of the present disclosure, the memory capacity of a semiconductor structure may depend on how many standardized DRAM chiplet structures 100 are included in a block unit 110, and as the example shown in FIGS. 12A and 12B, it is much easier in bonding each block unit 110 over the logic SOC 400 than bonding three DRAM chiplet structures 100 separately over the logic SOC 400, or the interposer 500 or the substrate 600 in other embodiments. The area occupied by the DRAM may be reduced as well, because there is no physical gap between adjacent DRAM chiplet structures.

Figure 13:
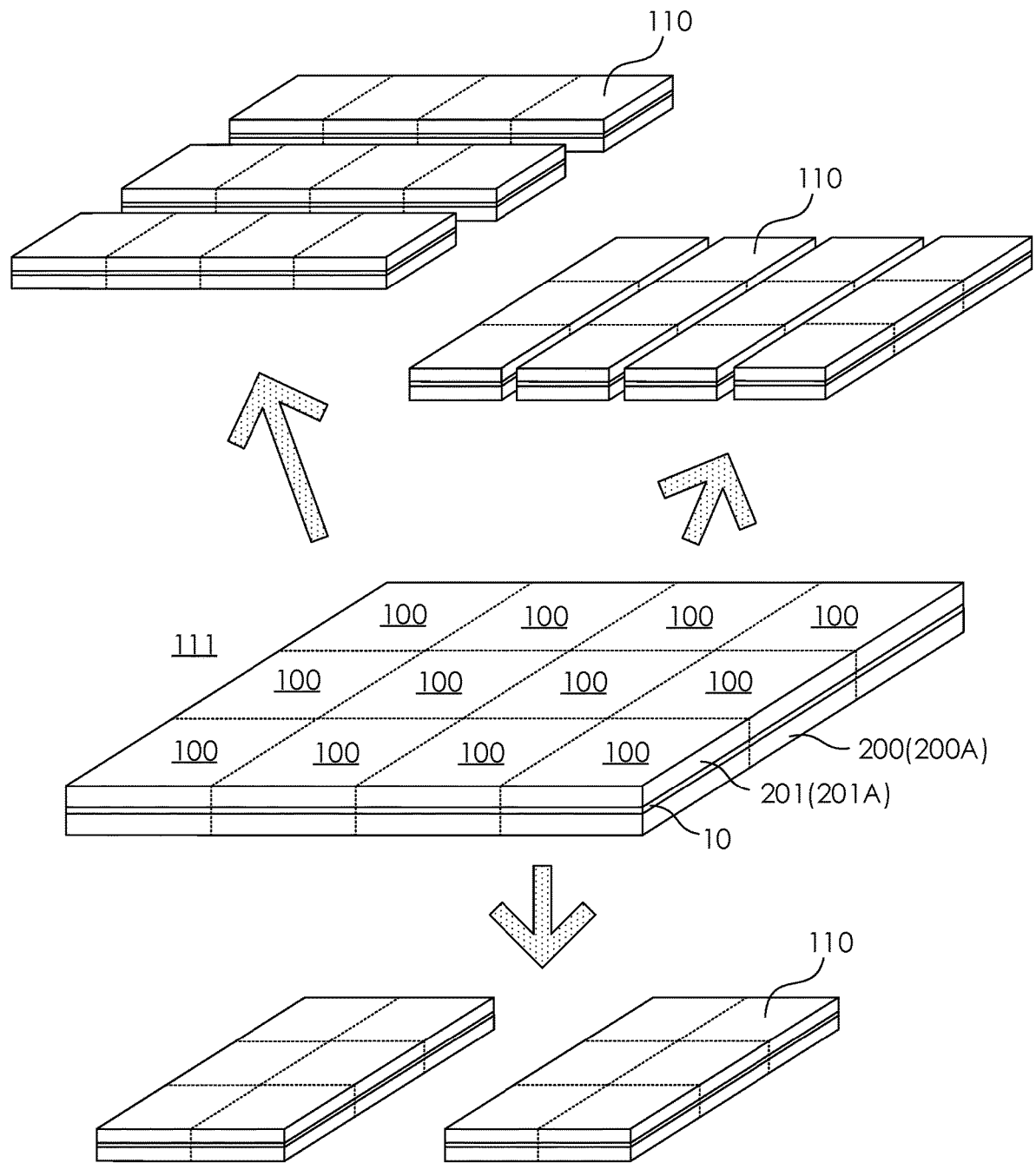
FIG. 13 illustrates a three-dimensional illustration of a pre-diced bonded wafer and possible block units according to some embodiments of the present disclosure.

Furthermore, it is much more flexible to DRAM manufacturers and vendors in utilizing the bonded first wafer 200A and the second wafer 201A as previously shown in FIG. 5C to fulfill the requirement of varying amount of memory in different usages. For example, as shown in FIG. 13, the second wafer 201A is hybrid bonded over the first wafer 200A through the first hybrid bonding structure 10, and a first bonded wafer 111 may be obtained accordingly. In some embodiments, the first bonded wafer 111 may be diced into a plurality of block units 110, while each of the block units 110 includes two or more DRAM chiplet structures 100 arranged in a row (e.g., see the upper portion of FIG. 13) or an array e.g., see the lower portion of FIG. 13). Each block unit 110 can functional independently. That is, in the embodiments that have a plurality of DRAM chiplet structures 100, these DRAM chiplet structures 100 may be arranged in a row or an array and free from being diced. In some embodiments, each of the DRAM chiplet structures 100 in the first bonded wafer 111 are tested through several standard electrical test operations to indicate known good dies (KGD), and the vendors may dice the first bonded wafer 111 to obtain the block units 110 that having KGDs only.

Figure 14A:
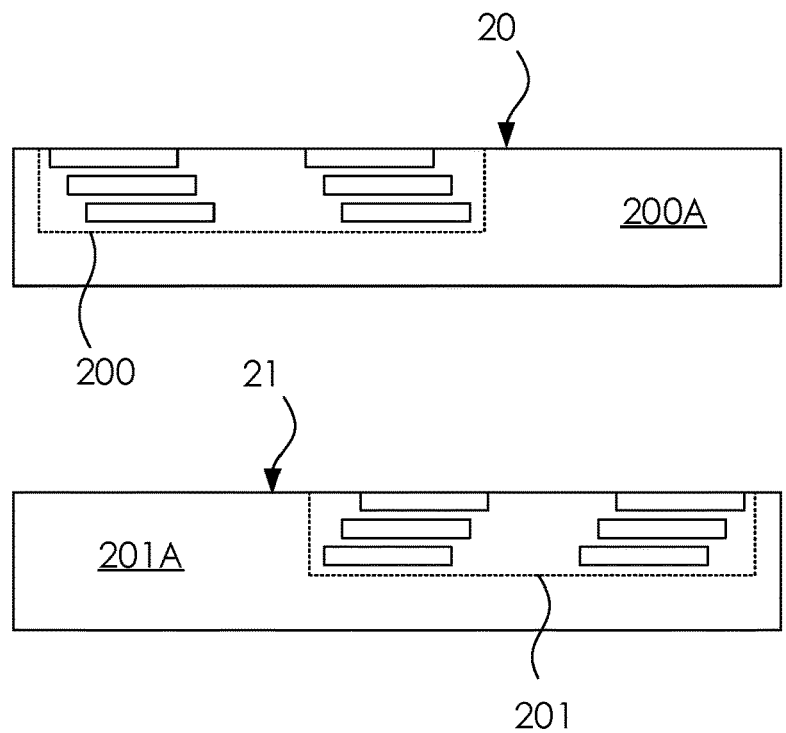
FIGS. 14A to 14D illustrate cross-sectional views of forming a semiconductor structure according to some embodiments of the present disclosure.

FIGS. 14A-14D illustrate the method for manufacturing a DRAM chiplet structure 100 describe in previously shown embodiments. As shown in FIG. 14A, in some embodiments, at least one structure 200 is formed on a face side 20 of a first wafer 200A, and at least one core structure 201 is formed on a face side 21 of a second wafer 201A. In some embodiments, the functional components such as data I/O buffers 211 and command and/or address buffers 212 are fabricated in the first wafer 200A as a portion of each of the interface structures 200, and some other functional components such as DRAM array regions 213, row decoders 214, and column decoders 215 are fabricated in the second wafer 201A as a portion of each of the core structures 201. Other than these functional components, the rest of functional components of DRAM may be selectively fabricated in the first wafer 200A or the second wafer 201A. In other words, the first wafer 200A or the interface structure 200 thereof is at least free from including a DRAM array region, a row decoder, or a column decoder, and the second wafer 201A or the core structure 201 thereof is at least free from including a data I/O buffer or a command and/or address buffer. The functional components of DRAM may refer to previously shown FIG. 6.

Figure 14B:
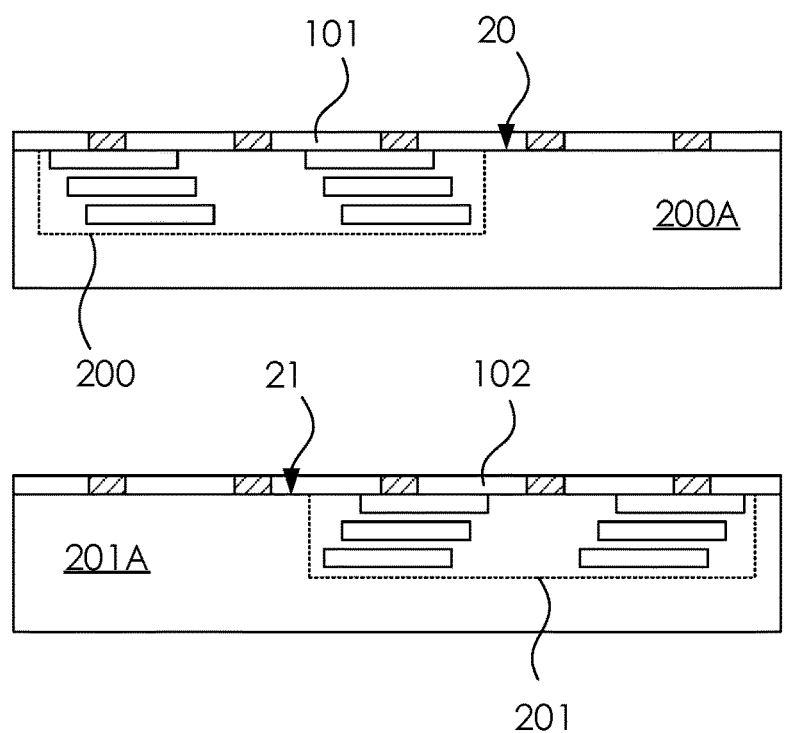

As shown in FIG. 14B, in some embodiments, a first hybrid bonding layer 101 is formed over the first wafer 200A having the DRAM interface structures 200, and a second hybrid bonding layer 102 is formed over the second wafer 201A having the first DRAM core structures 201. In some embodiments, one or more TSVs (not shown) may be formed adjacent to the face side 20 of the first wafer 200A and the face side 21 of the second wafer 201A, respectively, prior to forming the first hybrid bonding layer 101 and the second hybrid bonding layer 102. In some embodiments, some conductive structures such as those previously shown in FIG. 5C may be formed in the first hybrid bonding layer 101 and the second hybrid bonding layer 102 and are omitted here for brevity.

Figure 14C:
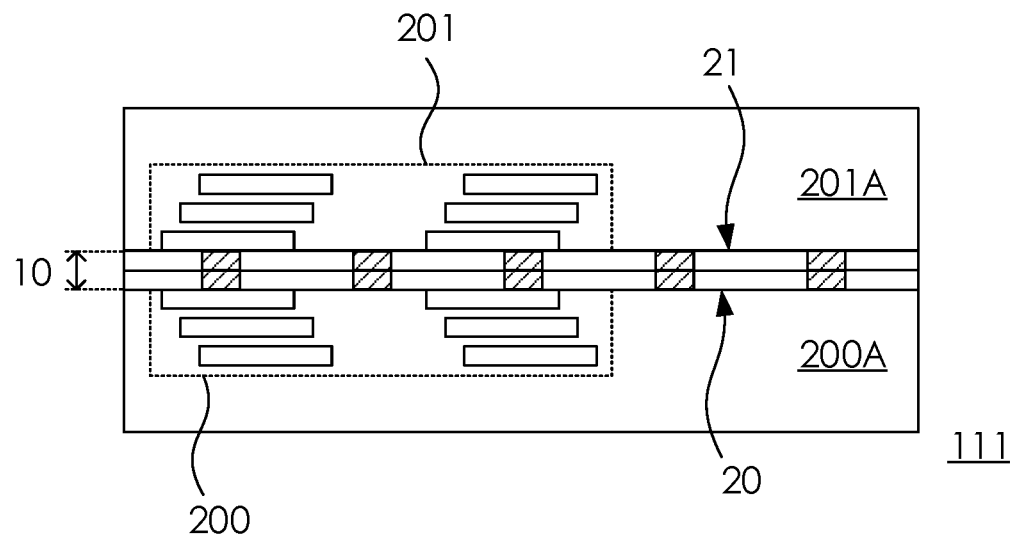

As shown in FIG. 14C, in some embodiments, the first wafer 200A and the second wafer 201A are bonded through a hybrid bonding operation to connect the first hybrid bonding layer 101 and the second hybrid bonding layer 102, thereby obtaining a first bonded wafer 111, and the interface structure 200 is electrically connected to the core structure 201 through the first hybrid bonding layer 101 and the second hybrid bonding layer 102. In such embodiments, the second wafer 201A is flipped to be stacked over the first wafer 200A by the hybrid bonding operation, wherein the face side 20 is facing the face side 21 and a face-to-face stack is thus performed.

Figure 14D:
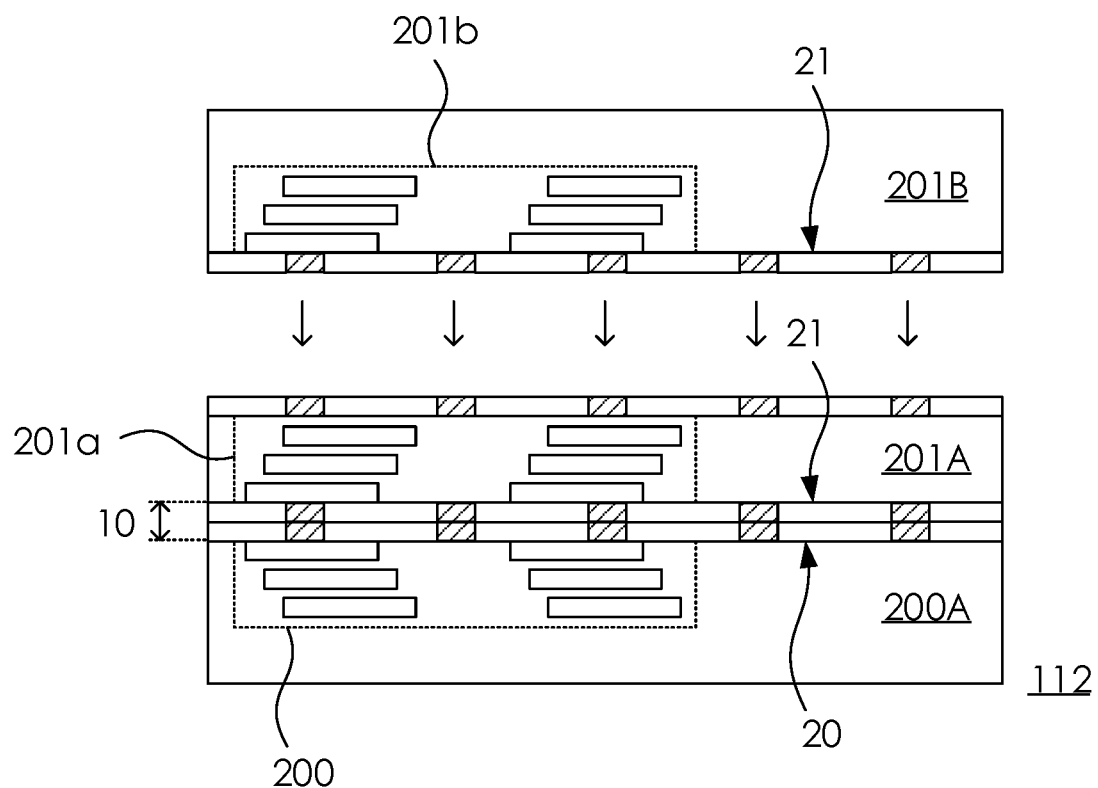

As shown in FIG. 14D, in some embodiments, a third wafer 201B may be bonded over the first bonded wafer 111 through a hybrid bonding operation to form a second bonded wafer 112, wherein the third wafer 201B also has a core structure, for example, a core structure 201b that substantially identical to the core structure 201a in the second wafer 201A. Prior to bonding the third wafer 201B and the first bonded wafer 111, a hybrid bonding layer is formed on the back side of the second wafer 201A, and another hybrid bonding layer is formed on the face side of the third wafer 201B for forming the second hybrid bonding structure 60 as previously discussed in. FIG. 11A. In some embodiments, prior to forming the hybrid bonding layer over the back side of the second wafer 201A, the back side of the second wafer 201A is thinned for exposing the TSV (not shown) in the second wafer 201A. In some embodiments, a TSV may penetrate the first wafer 200A, the first hybrid bonding structure 10, the second wafer 201A, and the second hybrid bonding structure 60 to in contact with the core structure 201b in the third wafer 201B and the interface structure 200. In some embodiments, a portion of such TSV may be formed prior to bonding the third wafer 2018 and the first bonded wafer 111.

In some embodiments, more hybrid bonding structure and wafers with core structures therein may be further stacked over the second bonded wafer 112 by more hybrid bonding operations. In some embodiments, after one or more wafers with core structures are bonded over the first wafer 200A through hybrid bonding operations, the bonded wafer (e.g., the first bonded wafer 111, the second bonded wafer 112, etc.) may be singulated to obtain one or more DRAM units having at least one DRAM chiplet structure 100.

Figure 14E:
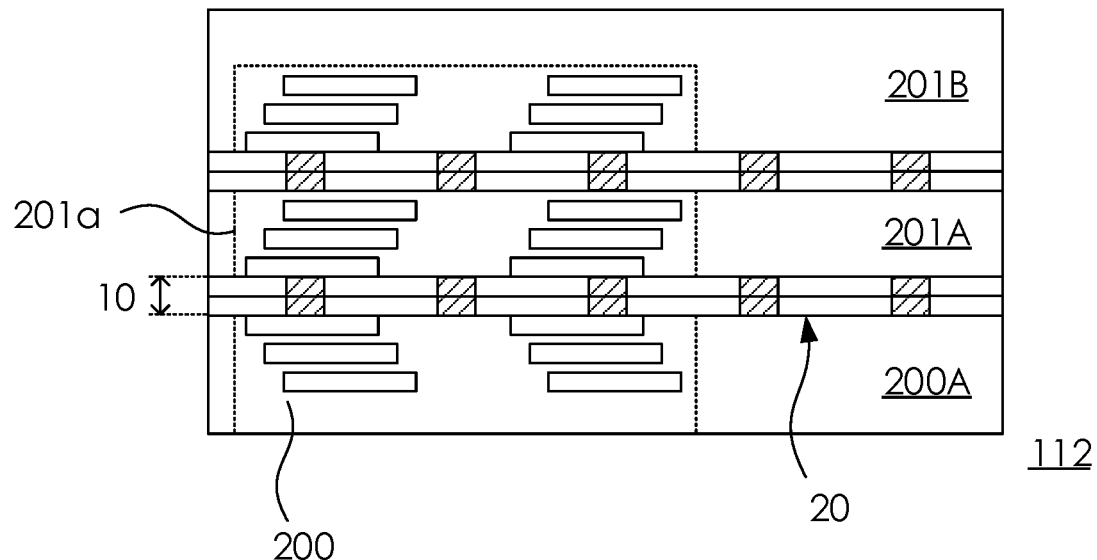
FIGS. 14E and 14F illustrate cross-sectional views of forming a semiconductor structure according to some embodiments of the present disclosure.
Figure 14F:
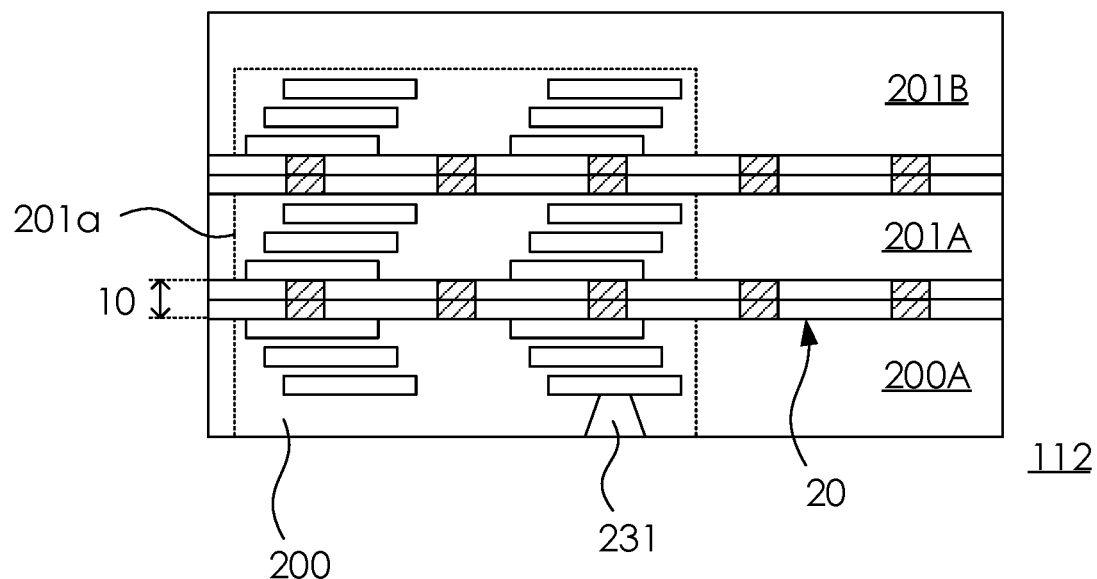

FIGS. 14E and 14F illustrate the embodiment that forming the BTSV 231 for the signal transmission between the interface structure 200 and the SOC die 400 as previously shown in FIGS. 11A and 11B. In such embodiment, the first wafer 200A is thinned by a CMP operation to a thickness adequate to form a TSV, such thickness can be less than about 10 µm. Subsequently, a via etching and a via filling operations are implemented at the polished side of the first wafer 200A to form the BTSV 231 electrically connected to the metallization structure in the interface structure 200.

Briefly, according to the above-mentioned embodiments, the functional components of DRAM may be separately formed in different wafers before being electrically connected through hybrid bonding operations. To be more precise, the interface of DRAM may be indecently formed in a wafer, and another wafer for forming DRAM arrays may be vertically stacked thereover through hybrid bonding structures, and thus the project area of the wafers maybe effectively used to arrange the internal data wires between the DRAM arrays and the DRAM interface, and therefore a high bandwidth of such DRAM chiplet structure may be achieved.

In one exemplary aspect, a DRAM chiplet structure is provided. The DRAM chiplet structure includes a first hybrid bonding structure, a DRAM interface structure, and a first DRAM core structure. The first hybrid bonding structure has a first surface and a second surface. The DRAM interface structure is in contact with the first surface of the first hybrid bonding structure. The first DRAM core structure is in contact with the second surface of the first hybrid bonding structure. The DRAM interface structure is electrically connected to the first DRAM core structure through the first hybrid bonding structure.

In another exemplary aspect, a semiconductor structure is provided. The semiconductor structure includes at least one DRAM chiplet structure and a semiconductor die. Each of the DRAM chiplet structures includes a DRAM interface structure and at least one DRAM core structure bonded over the DRAM interface structure through a wafer bonding technique. The semiconductor die has a logic circuit structure. The semiconductor die is electrically connected to the DRAM chiplet structure through a bonding structure.

In yet another exemplary aspect, a method for manufacturing a DRAM chiplet structure is provided. The method includes the following operations. A first hybrid bonding layer is formed over a first wafer having a DRAM interface structure. A second hybrid bonding layer is formed over a second wafer having a first DRAM core structure. The first wafer and the second wafer are bonded through a hybrid bonding operation to connect the first hybrid bonding layer and the second hybrid bonding layer, thereby obtaining a first bonded wafer, and the DRAM interface structure is electrically connected to the first DRAM core structure through the first hybrid bonding layer and the second hybrid bonding layer. The first bonded wafer is singulated to obtain a DRAM chiplet structure.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A DRAM chiplet structure, comprising:
   a first hybrid bonding structure having a first surface and a second surface;
   a DRAM interface structure in contact with the first surface of the first hybrid bonding structure; and
   a first DRAM core structure in contact with the second surface of the first hybrid bonding structure, and the DRAM interface structure is electrically connected to the first DRAM core structure through the first hybrid bonding structure.

2. The DRAM chiplet structure of claim 1, wherein the first DRAM core structure at least comprises a DRAM array region, a row decoder, and a column decoder.

3. The DRAM chiplet structure of claim 1, wherein the DRAM interface structure at least comprises a data I/O buffer and a command and/or address buffer.

4. The DRAM chiplet structure of claim 1, wherein the first DRAM core structure or the DRAM interface structure at least comprises a read/write buffer, a control logic, a test logic, a power supply, and/or a redundancy repair.

5. The DRAM chiplet structure of claim 1, further comprising:
   at least one second hybrid bonding structure over the first DRAM core structure; and
   at least one second DRAM core structure over the second hybrid bonding structure.

6. The DRAM chiplet structure of claim 5, further comprising a first through silicon via (TSV) electrically connects the second DRAM core structure and the DRAM interface structure.

7. The DRAM chiplet structure of claim 5, wherein the at least one second DRAM core structure includes a plurality of second DRAM core structures, and a topmost one of the second DRAM core structures is the thickest among the second DRAM core structures.

8. A semiconductor structure, comprising:
   at least one DRAM chiplet structure, each comprising:
     a DRAM interface structure; and
     at least one DRAM core structure bonded over the DRAM interface structure through a wafer bonding technique; and
   a semiconductor die having a logic circuit structure, wherein the semiconductor die is electrically connected to the DRAM chiplet structure through a bonding structure.

9. The semiconductor structure of claim 8, wherein the bonding structure comprises a first hybrid bonding structure between the DRAM chiplet structure and the semiconductor die.

10. The semiconductor structure of claim 8, wherein the bonding structure comprises a conductive bump connection in contact with the DRAM chiplet structure and the semiconductor die.

11. The semiconductor structure of claim 8, further comprising an interposer supporting the DRAM chiplet structure and the semiconductor die.

12. The semiconductor structure of claim 8, wherein the semiconductor die comprises a plurality of second TSVs in contact with the bonding structure.

13. The semiconductor structure of claim 8, further comprising:
   a dielectric material surrounding the DRAM chiplet structure; and
   a plurality of vias surrounded by the dielectric material, the plurality of vias in contact with the semiconductor die and a conductive bump, wherein the DRAM chiplet structure is between the semiconductor die and the conductive bump.

14. The semiconductor structure of claim 8, wherein the at least one DRAM core structure includes a plurality of DRAM core structure electrically connected to each other through a plurality of second hybrid bonding structures.

15. The semiconductor structure of claim 8, wherein the at least one DRAM chiplet structure includes a plurality of DRAM chiplet structures arranged in a row or an array and free from being diced.

16. A method for manufacturing a DRAM chiplet structure, the method comprising:
   forming a first hybrid bonding layer over a first wafer having a DRAM interface structure;
   forming a second hybrid bonding layer over a second wafer having a first DRAM core structure;
   bonding the first wafer and the second wafer through a hybrid bonding operation to connect the first hybrid bonding layer and the second hybrid bonding layer, thereby obtaining a first bonded wafer, and the DRAM interface structure is electrically connected to the first DRAM core structure through the first hybrid bonding layer and the second hybrid bonding layer; and
   singulating the first bonded wafer to obtain a DRAM chiplet structure.

17. The method of claim 16, wherein the DRAM interface structure comprises a data I/O buffer and a command and/or address buffer.

18. The method of claim 16, wherein the first DRAM core structure comprises a DRAM array region, a row decoder, and a column decoder.

19. The method of claim 16, further comprising:
   bonding a third wafer over the first bonded wafer through a hybrid bonding operation, wherein the third wafer has a second DRAM core structure.

20. The method of claim 16, further comprising:
   forming a TSV in the second wafer prior to bonding the third wafer and the first bonded wafer.

* * * * *